United States Patent
Liu et al.

(10) Patent No.: US 11,956,954 B2
(45) Date of Patent: Apr. 9, 2024

(54) ELECTRONIC DEVICES COMPRISING REDUCED CHARGE CONFINEMENT REGIONS IN STORAGE NODES OF PILLARS AND RELATED METHODS

(71) Applicant: Micron Technology, Inc., Boise, ID (US)

(72) Inventors: Yifen Liu, Boise, ID (US); Yan Song, Singapore (SG); Albert Fayrushin, Boise, ID (US); Naiming Liu, Boise, ID (US); Yingda Dong, Los Altos, CA (US); George Matamis, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 584 days.

(21) Appl. No.: 17/092,916

(22) Filed: Nov. 9, 2020

(65) Prior Publication Data

US 2022/0149068 A1 May 12, 2022

(51) Int. Cl.
*H10B 43/27* (2023.01)
*H01L 23/522* (2006.01)
*H10B 43/10* (2023.01)
*H10B 43/35* (2023.01)
*H10B 43/40* (2023.01)

(52) U.S. Cl.
CPC ......... *H10B 43/27* (2023.02); *H01L 23/5226* (2013.01); *H10B 43/10* (2023.02); *H10B 43/35* (2023.02); *H10B 43/40* (2023.02)

(58) Field of Classification Search
CPC ........ H10B 43/27; H10B 43/10; H10B 43/35; H10B 43/40; H01L 23/5226; H01L 29/7926; H01L 29/40117
See application file for complete search history.

(56) References Cited

U.S. PATENT DOCUMENTS

| | | | |
|---|---|---|---|
| 9,666,593 B2 | 5/2017 | Pang et al. | |
| 10,446,572 B2 | 10/2019 | Carlson | |
| 10,593,695 B1* | 3/2020 | Kim | H01L 29/40114 |
| 10,680,006 B2 | 6/2020 | Carlson | |

(Continued)

FOREIGN PATENT DOCUMENTS

WO 2019/236158 A1 12/2019

OTHER PUBLICATIONS

International Search Report for Application No. PCT/US2021/056468, dated Feb. 16, 2022, 3 pages.

(Continued)

*Primary Examiner* — Calvin Y Choi

(74) *Attorney, Agent, or Firm* — TraskBritt

(57) ABSTRACT

An electronic device comprises a stack of alternating dielectric materials and conductive materials, a pillar region extending vertically through the stack, an oxide material within the pillar region and laterally adjacent to the dielectric materials and the conductive materials of the stack, and a storage node laterally adjacent to the oxide material and within the pillar region. A charge confinement region of the storage node is in horizontal alignment with the conductive materials of the stack. A height of the charge confinement region in a vertical direction is less than a height of a respective, laterally adjacent conductive material of the stack in the vertical direction. Related methods and systems are also disclosed.

28 Claims, 8 Drawing Sheets

(56) References Cited

U.S. PATENT DOCUMENTS

| | | |
|---|---|---|
| 2014/0087534 A1 | 3/2014 | Choe et al. |
| 2015/0357413 A1 | 12/2015 | Zhang et al. |
| 2016/0307915 A1 | 10/2016 | Pang et al. |
| 2016/0351582 A1 | 12/2016 | Kim et al. |
| 2017/0229474 A1 | 8/2017 | Shimizu et al. |
| 2017/0271527 A1 | 9/2017 | Higuchi et al. |
| 2017/0278851 A1 | 9/2017 | Fuji et al. |
| 2020/0098785 A1* | 3/2020 | Kariya .................. H10B 43/10 |

OTHER PUBLICATIONS

Written Opinion of the International Searching Authority for Application No. PCT/US2021/056468, dated Feb. 16, 2022, 5 pages.

* cited by examiner

ELECTRONIC DEVICES COMPRISING REDUCED CHARGE CONFINEMENT REGIONS IN STORAGE NODES OF PILLARS AND RELATED METHODS

TECHNICAL FIELD

Embodiments disclosed herein relate to electronic devices and electronic device fabrication. More particularly, embodiments of the disclosure relate to electronic devices comprising reduced charge confinement regions in storage nodes of pillars and to related methods and systems.

BACKGROUND

Electronic device (e.g., semiconductor device, memory device) designers often desire to increase the level of integration or density of features (e.g., components) within an electronic device by reducing the dimensions of the individual features and by reducing the separation distance between neighboring features. Electronic device designers also desire to design architectures that are not only compact, but offer performance advantages, as well as simplified designs. Reducing the dimensions and spacing of features has placed increasing demands on the methods used to form the electronic devices. One solution has been to form three-dimensional (3D) electronic devices, such as 3D NAND devices, in which memory cells are stacked vertically on a substrate.

In some 3D NAND devices, the vertical structure may include a charge storage structure (e.g., a "charge trap" structure, which may also be known as a "storage node"). The charge trap structure may include a charge storage material (e.g., a dielectric material) operable to effectively "trap" and store an electrical charge during writing of the electronic device. Erasing the electronic device effectively removes the electrical charge from the charge trap structure.

However, as the memory cells are formed closer together and at smaller dimensions, cell-to-cell coupling and interference between neighboring memory cells (e.g., NAND memory cells) increases, lateral charge migration increases, and program erase and data retention issues arise.

DETAILED DESCRIPTION

Figure 1A:
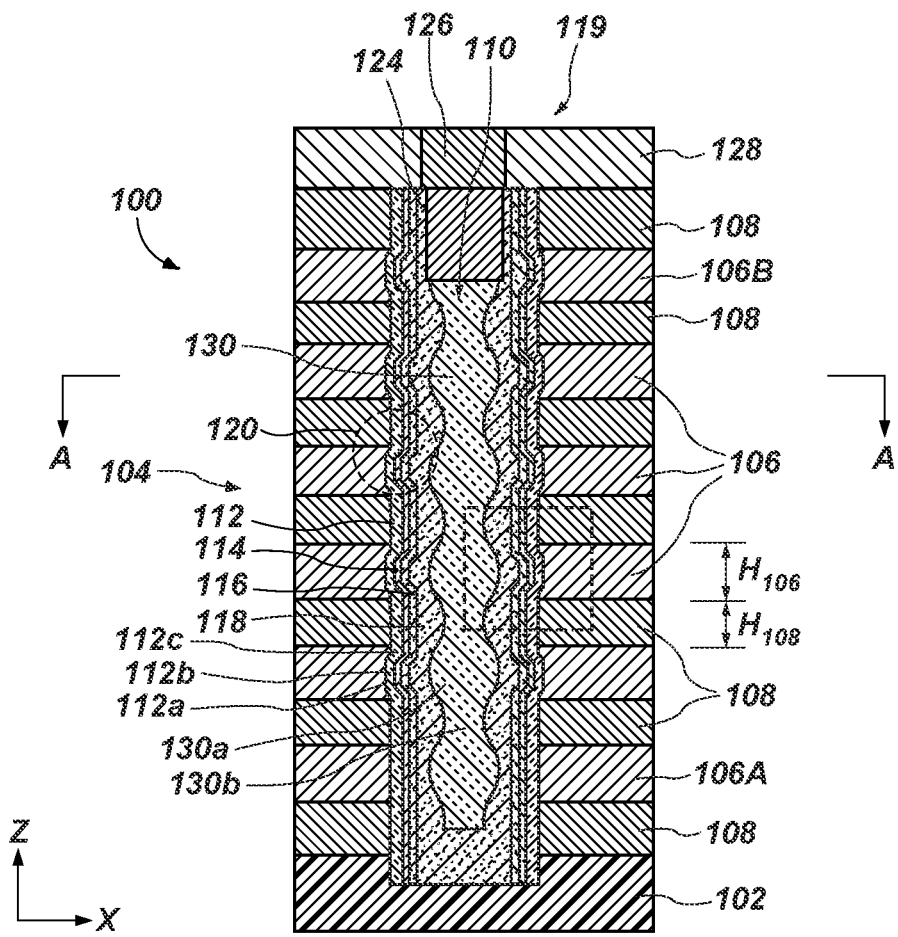
FIG. 1A is a cross-sectional view of an electronic device including reduced charge confinement regions in storage nodes of pillars according to embodiments of the disclosure.

An electronic device (e.g., an apparatus, a semiconductor device, a memory device) that includes reduced charge confinement regions in a vertical direction (e.g., in the Z-direction) in storage nodes of pillars is disclosed. A pillar region of the electronic device extends vertically through a stack of alternating dielectric materials and conductive materials. An oxide material (e.g., a block oxide material) within the pillar region is laterally adjacent to the dielectric materials and the conductive materials of the stack, and a storage node is laterally adjacent to the oxide material and within the pillar region. The storage node extends continuously in a vertical direction and includes charge confinement regions in horizontal alignment with the conductive materials of the stack without being in horizontal alignment with the dielectric materials of the stack. A height of a charge confinement region in a vertical direction is less than a height of a respective, laterally adjacent conductive material of the stack in the vertical direction. The conductive materials of the stack adjacent to the pillar region include recessed regions relative to the dielectric materials of the stack. A portion of the oxide material is located within the recessed regions of the conductive materials and vertically adjacent to neighboring portions of the dielectric materials. Pillar materials, including a channel material located laterally adjacent to the storage node, may exhibit so-called "waviness," such that portions of the channel material extend farther into a central portion of the pillar region in a controlled manner relative to additional portions of the channel material.

The oxide material may be present at different thicknesses between the conductive materials of the stack and the storage node to more effectively contain charge in the charge confinement regions in the vertical direction. An insulative material (e.g., a fill material, a central insulative material) within the pillar region also has a varying thickness along a vertical direction thereof. By adjusting the relative thicknesses of the oxide material, portions of the oxide material are vertically adjacent to the charge confinement regions of the storage node. Therefore, an increased separation distance between adjacent charge confinement regions is achieved while the storage node remains continuous in the vertical direction. While the oxide material thickness may vary, a critical dimension (CD) of the pillar may remain substantially the same. The increased separation distance between the adjacent charge confinement regions may reduce lateral charge migration and allow a decreased separation distance between individual conductive materials (e.g., wordlines) of the stack and respective charge confinement regions of the storage nodes of the pillars for increased device control of the wordlines. The presence of the oxide materials, which are vertically adjacent to respective charge confinement regions of the storage node, and within the recessed regions of the conductive materials does not negatively affect electrical performance properties, such as wordline resistance, cell-to-cell coupling between the memory cells that are controlled by vertically neighboring wordlines, program and erase performance, data retention, etc., of the electronic device.

The following description provides specific details, such as material types, material thicknesses, and process conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete description of an electronic device or a complete process flow for manufacturing the electronic device and the structures described below do not form a complete electronic device. Only those process acts and structures necessary to understand the embodiments described herein are described in detail below. Additional acts to form a complete electronic device may be performed by conventional techniques.

Unless otherwise indicated, the materials described herein may be formed by conventional techniques including, but not limited to, spin coating, blanket coating, chemical vapor deposition (CVD), atomic layer deposition (ALD), plasma enhanced ALD, physical vapor deposition (PVD) (including sputtering, evaporation, ionized PVD, and/or plasma-enhanced CVD), or epitaxial growth. Alternatively, the materials may be grown in situ. Depending on the specific material to be formed, the technique for depositing or growing the material may be selected by a person of ordinary skill in the art. The removal of materials may be accomplished by any suitable technique including, but not limited to, etching (e.g., dry etching, wet etching, vapor etching), ion milling, abrasive planarization (e.g., chemical-mechanical planarization), or other known methods unless the context indicates otherwise.

Drawings presented herein are for illustrative purposes only, and are not meant to be actual views of any particular material, component, structure, electronic device, or electronic system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the singular forms "a," "an," and "the" are intended to include the plural forms as well, unless the context clearly indicates otherwise.

As used herein, "and/or" includes any and all combinations of one or more of the associated listed items.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the term "configured" refers to a size, shape, material composition, and arrangement of one or more of at least one structure and at least one apparatus facilitating operation of one or more of the structure and the apparatus in a pre-determined way.

As used herein, the term "electronic device" includes, without limitation, a memory device, as well as semiconductor devices which may or may not incorporate memory, such as a logic device, a processor device, or a radiofrequency (RF) device. Further, an electronic device may incorporate memory in addition to other functions such as, for example, a so-called "system on a chip" (SoC) including a processor and memory, or an electronic device including logic and memory. The electronic device may, for example, be a 3D electronic device, such as a 3D NAND Flash memory device.

As used herein, the term "high-k dielectric material" means and includes a dielectric oxide material having a dielectric constant greater than the dielectric constant of silicon oxide ($SiO_x$), such as silicon dioxide ($SiO_2$). The high-k dielectric material may include, but is not limited to, a high-k oxide material, a high-k metal oxide material, or a combination thereof. By way of example only, the high-k dielectric material may be aluminum oxide, gadolinium oxide, hafnium oxide, niobium oxide, tantalum oxide, titanium oxide, zirconium oxide, hafnium silicate, a combination thereof, or a combination of one or more of the listed high-k dielectric materials with silicon oxide.

As used herein, reference to an element as being "on" or "over" another element means and includes the element being directly on top of, adjacent to (e.g., laterally adjacent to, vertically adjacent to), underneath, or in direct contact with the other element. It also includes the element being indirectly on top of, adjacent to (e.g., laterally adjacent to, vertically adjacent to), underneath, or near the other element, with other elements present therebetween. In contrast, when an element is referred to as being "directly on" or "directly adjacent to" another element, no intervening elements are present.

As used herein, the term "selectively etchable" means and includes a material that exhibits a greater etch rate responsive to exposure to a given etch chemistry and/or process conditions relative to another material exposed to the same etch chemistry and/or process conditions. For example, the material may exhibit an etch rate that is at least about five times greater than the etch rate of another material, such as an etch rate of about ten times greater, about twenty times greater, or about forty times greater than the etch rate of the another material. Etch chemistries and etch conditions for selectively etching a desired material may be selected by a person of ordinary skill in the art.

As used herein, the term "sacrificial," when used in reference to a material or structure, means and includes a material, structure, or a portion of a material or structure that is formed during a fabrication process but which is removed (e.g., substantially removed) prior to completion of the fabrication process.

As used herein, the term "stack" or "stacks" means and includes a feature having one or more materials vertically adjacent to one another. The stacks may include alternating dielectric materials and conductive materials, such as alternating oxide materials and metal materials or alternating oxide materials and polysilicon materials. Depending on the stage of fabrication of the electronic device containing the stacks, the stacks may alternatively include alternating dielectric materials and nitride materials, such as alternating oxide materials and silicon nitride materials.

As used herein, "conductive material" means and includes an electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pa), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively-doped semiconductor material (e.g., conductively-doped polysilicon, conductively-doped germanium (Ge), conductively-doped silicon germanium (SiGe)).

As used herein, a "conductive structure" means and includes a structure formed of and including a conductive material.

As used herein, "insulative material" means and includes an electrically insulative material, such one or more of at least one dielectric oxide material (e.g., one or more of a silicon oxide (SiOx), phosphosilicate glass, borosilicate glass, borophosphosilicate glass, fluorosilicate glass, an aluminum oxide (AlOx), a hafnium oxide (HfOx), a niobium oxide (NbOx), a titanium oxide (TiOx), a zirconium oxide (ZrOx), a tantalum oxide (TaOx), and a magnesium oxide (MgOx)), at least one dielectric nitride material (e.g., a silicon nitride (SiNy)), at least one dielectric oxynitride material (e.g., a silicon oxynitride (SiOxNy)), and at least one dielectric carboxynitride material (e.g., a silicon carboxynitride (SiOxCzNy)).

As used herein, an "insulative structure" means and includes a structure formed of and including an insulative material.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, the term "substrate" means and includes a material (e.g., a base material) or construction upon which additional materials are formed. The substrate may be an electronic substrate, a semiconductor substrate, a base semiconductor layer on a supporting structure, an electrode, an electronic substrate having one or more materials, layers, structures, or regions formed thereon, or a semiconductor substrate having one or more materials, layers, structures, or regions formed thereon. The materials on the electronic substrate or semiconductor substrate may include, but are not limited to, semiconductive materials, insulating materials, conductive materials, etc. The substrate may be a conventional silicon substrate or other bulk substrate comprising a layer of semiconductive material. As used herein, the term "bulk substrate" means and includes not only silicon wafers, but also silicon-on-insulator ("SOT") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

As used herein, the terms "vertical," "longitudinal," "horizontal," and "lateral" are in reference to a major plane of a structure and are not necessarily defined by Earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure.

An electronic device 100 according to embodiments of the disclosure and including the oxide materials is shown in FIG. 1A. The electronic device 100 includes a stack 104 of alternating tiers of conductive materials 106 (e.g., conductive gate materials) and dielectric materials 108 overlying a base material 102 (e.g., a conductive line, such as a source line). A pillar 119 (e.g., a memory pillar) is located with an opening 110 (e.g., a pillar region) extending vertically through the stack 104. The pillar 119 includes an oxide material 112, a storage node 114, a tunnel region 116, a channel material 118, and an insulative material 130. The oxide material 112 (e.g., a block oxide material) of the pillar 119 is laterally adjacent to the stack 104 within the opening 110. The storage node 114 (e.g., a nitride material) is laterally adjacent (e.g., inwardly laterally adjacent) to the oxide material 112 and the tunnel region 116 (e.g., an inner oxide material) is laterally adjacent (e.g., inwardly laterally adjacent) to the storage node 114. Each of the oxide material 112, the storage node 114, and the tunnel region 116 are continuous (e.g., extend continuously) in the vertical direction (Z-direction) of the opening 110. One or more of a height $H_{108}$ of the dielectric materials 108 and a height $H_{106}$ of the conductive materials 106 may be selected to achieve the desired performance requirements of the storage node 114, as described in greater detail below.

An uppermost conductive material 106B is isolated from a lowermost conductive material 106A and proximate an upper surface of the stack 104. The lowermost conductive material 106A may be configured as a lowermost conductive gate material and the uppermost conductive material 106B may be configured as an uppermost conductive gate material. The channel material 118 is laterally adjacent (e.g., inwardly laterally adjacent) to the tunnel region 116 and adjacent to (e.g., on or over) the base material 102. The insulative material 130 extends between inner sidewalls of the channel material 118. The insulative material 130 is located in a central portion of the pillar 119 and may function as a structural support within the electronic device 100. The insulative material 130 may be referred to herein as a central dielectric material. A plug material 124 (e.g., a drain contact plug material) is adjacent to (e.g., on or over) each of the channel material 118 and the insulative material 130 and is laterally adjacent (e.g., inwardly laterally adjacent) to the channel material 118. A data line 126 (e.g., bit line, digit line) is adjacent to (e.g., on or over) the plug material 124 and laterally adjacent to (e.g., substantially surrounded by) a cap material 128 adjacent to (e.g., on or over) upper surfaces of the stack 104.

Individual conductive materials 106 of the stack 104, and portions of the oxide material 112, the storage node 114, the tunnel region 116, and the channel material 118 laterally neighboring the individual conductive materials 106 may form an individual memory cell 120 having a so-called metal-oxide-nitride-oxide-semiconductor ("MONOS") configuration. In additional embodiments, the memory cell 120 comprises a so-called "TANOS" (tantalum nitride-aluminum oxide-nitride-oxide-semiconductor) memory cell, or a so-called "BETANOS" (band/barrier engineered TANOS) memory cell. A vertical stack of multiple (e.g., more than one) memory cells 120 within the opening 110 may form a vertical string (e.g., vertical series) of the memory cells 120. By way of non-limiting example, the electronic device 100 includes three-dimensional NAND Flash memory cells. The data line 126 may provide electrical access to the memory cells 120. One or more (e.g., from one to five) of the lowermost conductive materials 106, 106A may be configured as select gate sources ("SGSs"). One or more (e.g., from one to five) of the uppermost conductive materials 106, 106B may be configured as select gate drains ("SGDs"). The conductive materials 106 between the select gate source(s) and the select gate drain(s) may be configured as access lines (e.g., word lines). As shown in FIG. 1A, the opening 110 may comprise an elongated opening (e.g., aperture, via) extending from an uppermost surface of the stack 104 to a lowermost surface of the stack 104. In additional embodiments, the opening 110 may exhibit a so-called "U-shaped" configuration having a pair of ends at the uppermost surface of the stack 104.

Figure 1B:
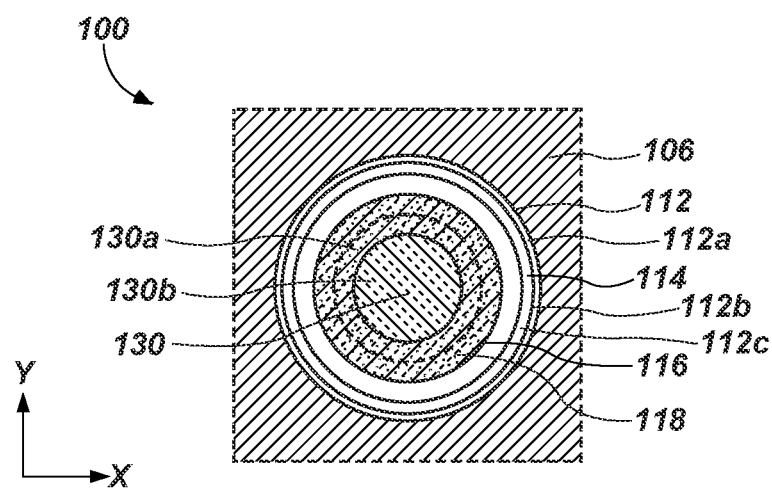
FIG. 1B is a top down view of the electronic device of FIG. 1A taken along the A-A line.

FIG. 1B illustrates a simplified partial top-down view of the electronic device 100 taken along the A-A line of FIG. 1A. Referring to FIG. 1A in combination with FIG. 1B, the oxide material 112 includes first regions 112a directly adjacent to the stack 104, second regions 112b directly adjacent to the first regions 112a, and third regions 112c between and directly adjacent to the second regions 112b and the storage node 114. For convenience, the first regions 112a, the second regions 112b, and the third regions 112c are shown in the drawings as separate portions of the oxide material 112, although it is understood that the oxide material 112 includes continuous portions of one or more (e.g., a single) material. Accordingly, the first regions 112a, the second regions 112b, and the third regions 112c may be formed from and include substantially the same chemical composition with no easily discernable physical interface therebetween. The insulative material 130 includes a first region 130a laterally adjacent to the channel material 118 and a second region 130b in a central portion of the opening 110 (e.g., along a central axis of the pillar 119). For convenience, the first region 130a and the second region 130b are shown in the drawings as separate portions of the insulative material 130, although it is understood that the insulative material 130 includes a continuous portion of one or more (e.g., a single) material. Accordingly, the first region 130a and the second region 130b may be formed from and include substantially the same chemical composition with no easily discernable physical interface therebetween.

Figure 1C:
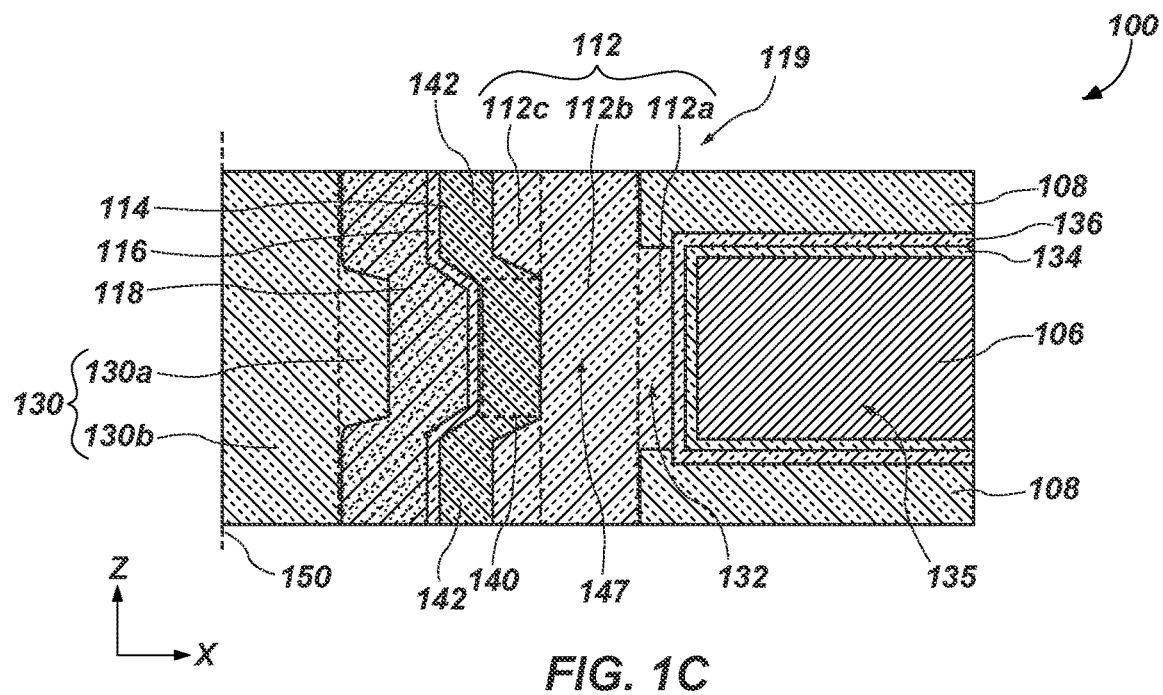
FIGS. 1C and 1D are cross-sectional views of enlarged portions of the electronic device of FIG. 1A.
Figure 1D:
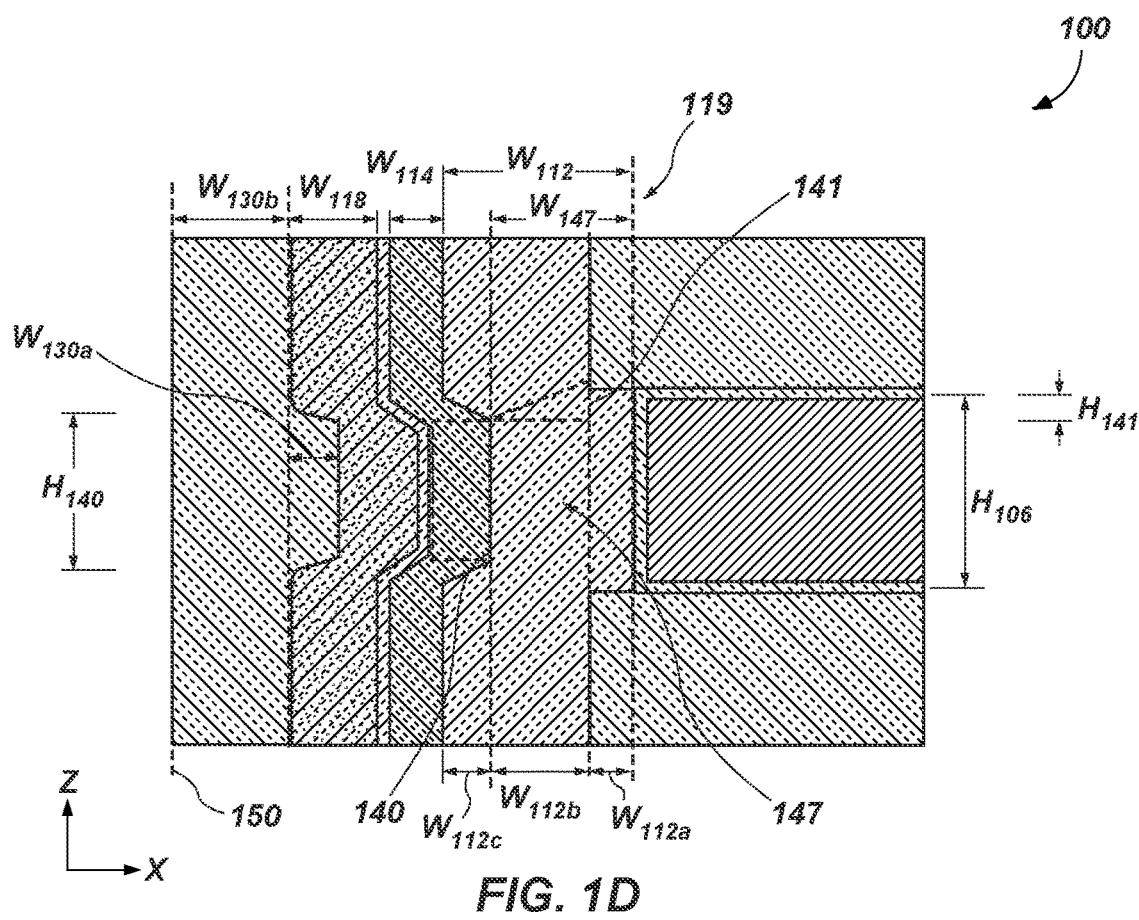

FIGS. 1C and 1D are enlarged views of the boxed region of the electronic device 100 of FIG. 1A. For simplicity, only a portion of the electronic device 100 is illustrated in FIGS. 1C and 1D, with the understanding that the electronic device 100 is symmetric with respect to the central axis 150 of the pillar 119. Referring to FIG. 1C, the second regions 112b extend continuously in the vertical direction of the opening 110, while the first regions 112a and the third regions 112c are separated into portions that are separated from one another in the vertical direction. The first regions 112a are proximal to the conductive materials 106 and the third regions 112c are distal to the conductive materials 106. The first regions 112a of the oxide material 112 includes portions of the oxide material 112 laterally adjacent to inner sidewalls of the conductive materials 106 and vertically separated from one another by the dielectric materials 108. The inner sidewalls of the conductive materials 106 may be recessed relative to inner sidewalls of the dielectric materials 108 to enable the first regions 112a to be within the recessed regions defined by the conductive materials 106. The second regions 112b extend in the vertical direction with outer sidewalls directly adjacent to inner sidewalls of the first regions 112a and the dielectric materials 108. The third regions 112c include portions of the oxide material 112 laterally adjacent to the dielectric materials 108 and separated from one another in the vertical direction by portions (e.g., charge confinement regions) of the storage node 114.

In addition to being laterally adjacent to the dielectric materials 108, the third regions 112c may be laterally adjacent to a portion of the conductive materials 106, without being laterally adjacent to an entirety of the conductive materials 106 in the vertical direction. In other words, the second region 112b of the oxide material 112 is substantially continuous and includes substantially vertical sidewalls, while each of the first regions 112a and the third regions 112c include portions of oxide material 112 along opposing sidewalls of the second region 112b. For example, the first region 112a extends a greater lateral distance away from a center of the opening 110 relative to outer sidewalls of the second region 112b and the third region 112c extends a greater lateral distance into the opening 110 relative to inner sidewalls of the second region 112b. In some embodiments, portions (e.g., uppermost portions, lowermost portions) of the third region 112c vertically overlap portions (e.g., uppermost portions, lowermost portions) of the first region 112a. In other words, portions of the first region 112a and the third region 112c may be horizontally aligned with one another in a plane that is horizontally aligned with the conductive materials 106. The recessed regions of the conductive materials 106 in combination with the varying thicknesses of the oxide material 112 (e.g., the first regions 112a, the second regions 112b, the third regions 112c) may facilitate regions of reduced charge confinement in a vertical direction (e.g., the Z-direction) of the storage node 114 of the pillar 119.

The recessed regions of the conductive materials 106 and the varying thicknesses of the oxide material 112 may also result in the insulative material 130 being formed at varying thicknesses along a vertical distance thereof. For example, each of the storage node 114, the tunnel region 116, and the channel material 118 may individually exhibit thicknesses (e.g., widths) that are substantially uniform along a vertical distance of the pillar 119. The recessed regions of the conductive materials 106 are, therefore, translated into the oxide material 112 and subsequently into each of the storage node 114, the tunnel region 116, and the channel material 118. The insulative material 130 may substantially completely fill a remainder of the opening 110 (e.g., a substantially cylindrical opening) so as to fully laterally extend between the inner sidewalls of the channel material 118. As best shown in FIGS. 1A and 1B, the channel material 118 may substantially surround (e.g., substantially continuously surround) the insulative material 130.

The second region 130b extends vertically within the opening 110 with outer sidewalls directly adjacent to inner sidewalls of each of the first region 130a and the channel material 118. The first region 130a of the insulative material 130 is in horizontal alignment with a portion (e.g., a vertically central portion) of the respective conductive materials 106 of the stack 104. In other words, the second region 130b of the insulative material 130 includes a continuous portion having substantially vertical sidewalls and the first region 130a includes additional portions of the insulative material 130 extending beyond the vertical sidewalls of the second region 130b (e.g., to a greater lateral width from the center of the opening 110) relative to the second region 130b. Since a portion of the oxide material 112 (e.g., the first regions 112a) are within the recessed regions of the conductive materials 106 and the width of the oxide material 112 varies and since individual widths of intervening materials are substantially uniform along the pillar 119, the width of the insulative material 130 also varies in the vertical direction. The channel material 118 and the insulative material 130 exhibit a so-called "waviness" in that the channel material 118 and the insulative material 130 do not exhibit substantially vertical sidewalls. Accordingly, a width (e.g., thickness) of the insulative material 130 may vary within the opening 110 according to alternating elevations of the conductive materials 106 and the dielectric materials 108 of the stack 104. Since the storage node 114, the tunnel region 116, and the channel material 118 are individually conformally formed, the widths (e.g., thicknesses) thereof are substantially uniform in the vertical direction. However, the storage node 114, the tunnel region 116, and the channel material 118 individually exhibit non-vertical sidewalls as a result of the recessed regions of the conductive materials 106. The insulative material 130 substantially fills the remaining portion of the opening 110 such that the insulative material 130 also has non-vertical sidewalls.

Referring to FIG. 1C in combination with FIG. 1D, the dielectric materials 108 of the stack 104 may be silicon oxide, silicon nitride, silicon oxynitride, or other dielectric material. In some embodiments, the dielectric materials 108 are silicon oxide. The conductive materials 106 of the stack 104 may be any conductive material including, but not limited to, n-doped polysilicon, p-doped polysilicon, undoped polysilicon, or a metal. Locations of the conductive materials 106 correspond to where sacrificial materials 105 (see, for example, FIG. 2A) of the stack 104 are initially present during fabrication of the electronic device 100. In some embodiments, the conductive material 106 is n-doped polysilicon. In other embodiments, the conductive material 106 is tungsten. A liner material 134 (e.g., a conductive liner material) is adjacent to the conductive materials 106 in cell openings 135 between vertically neighboring portions of the dielectric materials 108. The liner material 134 may be formed of and include, for example, a metal (e.g., titanium, tantalum), a metal nitride (e.g., tungsten nitride, titanium nitride, tantalum nitride), or another material. In some embodiments, the liner material 134 comprises titanium nitride.

In some embodiments, a high-k dielectric material 136 is present between the liner material 134 and the dielectric materials 108 in the cell openings 135. The high-k dielectric material 136 may, for example, be formed from aluminum oxide, hafnium oxide, zirconium oxide, tantalum oxide, a combination thereof, or a combination of silicon oxide and one or more of the listed materials. In some embodiments, the high-k dielectric material 136 is formed from hafnium-doped silicon dioxide, where the ratio of hafnium to silicon is controlled to achieve a desired etch selectivity of the high-k dielectric material 136. The high-k dielectric material 136 may be selected to exhibit high etch selectivity relative to the dielectric materials 108 of the tiers. In other embodiments, the high-k dielectric material 136 is absent from the cell openings 135 and the liner material 134 is immediately adjacent to (e.g., in direct physical contact with) each of the conductive materials 106 and the dielectric materials 108. For convenience, the high-k dielectric material 136 is absent in subsequent views of the drawings, although it is understood that the high-k dielectric material 136 may be present in additional embodiments of the disclosure. The liner material 134 and the high-k dielectric material 136, if present, are also between the first region 112a of the oxide material 112 and the conductive materials 106, such as between the first region 112a and an inner sidewall of the conductive materials 106. Since the conductive materials 106 are recessed, the dielectric materials 108 extend a greater distance in the horizontal direction than the conductive materials 106. Inner sidewalls of the dielectric materials 108 extend relatively closer to a central axis 150 of the pillar 119 than the inner sidewalls of the conductive materials 106. Accordingly, the first region 112a is laterally adjacent to the conductive materials 106 within a recess 132 and is bounded on upper and lower surfaces thereof by the dielectric materials 108. A transition between the first region 112a, the second region 112b, and the third region 112c may or may not exhibit an abrupt topographical change (e.g., a lip), as shown in FIG. 1C. In some embodiments, the transition between the individual regions of the oxide material 112 exhibits a gradual (e.g., tapered) transition. A thickness of the first region 112a may or may not be substantially similar to a thickness of the third region 112c. Accordingly, a combined thickness of the first region 112a and the second region 112b may or may not be substantially similar to a combined thickness of the second region 112b and the third region 112c.

As shown in FIG. 1C, a portion of the storage node 114 is located within a recess between the vertically adjacent portions of the third region 112c, which recess is in horizontal alignment with the recess 132. Accordingly, a portion of the tunnel region 116 is located within a corresponding recess of the storage node 114, a portion of the channel material 118 is within a corresponding recess of the tunnel region 116, and the first region 130a of the insulative material 130 is within a corresponding recess of the channel material 118. In other words, portions of the materials of the pillar 119 that are in horizontal alignment with the conductive materials 106 are recessed relative to other portions of the materials of the pillar 119. In some embodiments, at least some (e.g., each) of the materials of the pillar 119 exhibit a substantially equal thickness in the vertical direction, with the exception of the insulative material 130, which exhibits a width that varies in the vertical direction. In some such embodiments, an outer diameter of a portion of the insulative material 130 at an elevation of the conductive materials 106 is greater than an outer diameter of another portion of the insulative material 130 at an elevation of the dielectric materials 108 of the stack 104 (FIG. 1A). In other embodiments, one or more materials (e.g., the oxide material 112) of the pillar 119 exhibit a variable thickness in the vertical direction, in addition to that of the insulative material 130. For example, the oxide material 112 has a first thickness laterally adjacent to a vertically central portion of the conductive materials 106 and a second, greater thickness laterally adjacent to portions (e.g., uppermost portions, lowermost portions) of the conductive materials 106. As shown in FIG. 1D, a width $W_{130a}$ of the first region 130a of the insulative material 130 between the vertical sidewalls of a central portion of the channel material 118 and the vertical sidewalls of the other portions of the channel material 118 reflects the waviness of the channel material 118. Since the channel material 118 is conformally formed, a width thereof is substantially uniform in the vertical direction with portions of the channel material 118 laterally adjacent to the conductive materials 106 being recessed. A lateral distance (e.g., a width) of the recess 132 may substantially correspond to the width $W_{130a}$. In some embodiments, the channel material 118 is symmetric with respect to the central axis 150 of the pillar 119 along the vertical direction of the insulative material 130. For example, portions of the insulative material 130 horizontally aligned with the dielectric materials 108 may be narrower relative to additional portions of the insulative material 130 horizontally aligned with the conductive materials 106.

A charge confinement region 140 (shown by the dashed line in FIG. 1C) of the storage node 114 is in horizontal alignment with a portion (e.g., a vertically central portion) of the conductive materials 106 without being in horizontal alignment with the dielectric materials 108. Individual charge confinement regions 140 may be relatively closer to the conductive materials 106 than to the dielectric materials 108 in a horizontal direction (e.g., the X-direction). Since the charge confinement regions 140 of the storage node 114 are located within the recess between vertically adjacent portions of the third region 112c of the oxide material 112, the charge confinement region 140 is vertically aligned with the third regions 112c and horizontally aligned with the first regions 112a. In other words, portions of the oxide material 112 are vertically adjacent to the charge confinement regions 140 of the storage node 114. Peripheral regions 142 of the storage node 114 on opposing sides of the charge confinement region 140 are in horizontal alignment with the dielectric materials 108 and in horizontal alignment with portions (e.g., uppermost portions, lowermost portions) of the conductive materials 106. The peripheral regions 142 represent regions of the storage node 114 that are relatively less likely to storing charges than the charge confinement region 140. Side surfaces of the charge confinement region 140 are defined by an interface between the oxide material 112 (e.g., the second region 112b) and the storage node 114 and an interface between the oxide material 112 and the tunnel region 116. The charge confinement regions 140 being bounded on upper and lower surfaces thereof by the peripheral regions 142 facilitates increased control of the conductive materials 106 over the charge confinement region 140 of the storage node 114, which may reduce (e.g., minimize) lateral charge migration and coupling between adjacent storage nodes 114 that are horizontally aligned with respective wordlines (e.g., the conductive materials 106).

As shown in FIG. 1D, a portion of the third region 112c of the oxide material 112 is in horizontal alignment with each of the first region 112a and the conductive materials 106. In other words, a portion of the third region 112c vertically overlaps portions of each of the first region 112a and the conductive materials 106. A combined width $W_{147}$ of the first region 112a and the second region 112b of the oxide material 112 between an outer sidewall of the storage node 114 and the inner sidewall of the conductive materials 106 defines lateral segment 147 of the oxide material 112. A region 141 of the second region 112b of the oxide material 112 is located between an uppermost corner of a protruding portion of the storage node 114 and an inner sidewall of the first region 112a. The region 141 exhibits a substantially triangular shape (e.g., a right triangular shape) having a substantially triangular horizontal cross-sectional shape having one or more (e.g., two) sides having an acute angle relative to each of a horizontal direction (e.g., the X-direction) and a vertical direction (e.g., the Z-direction). A lower horizontally-extending boundary of the region 141 corresponds to a plane of an upper horizontally-extending boundary of the charge confinement region 140 of the storage node 114. Accordingly, the region 141 of the second region 112b is in horizontal alignment with portions of the third regions 112c, as well as with portions of the conductive materials 106. A vertically-extending boundary of the region 141 corresponds to an outer sidewall of the second region 112b (e.g., coincident with the inner sidewall of the first region 112a) along a plane of the inner sidewall of the dielectric materials 108. The vertically-extending boundary of the region 141 corresponds to a so-called "corner height" having a height $H_{141}$.

By way of non-limiting example, the height $H_{141}$ of the region 141 may be within a range of from about 3 nanometers (nm) and about 10 nm, such as between about 3 nm and about 6 nm, between about 6 nm and about 8 nm, or between about 8 nm and about 10 nm. Since a height $H_{140}$ (e.g., a length in a vertical direction) of the charge confinement region 140 is at least partially based on the height $H_{141}$ of the corner height of the region 141, an increased height $H_{141}$ of the corner height of the region 141 may result in a decreased height $H_{140}$ of the charge confinement region 140 in the vertical direction (e.g., the Z-direction). Therefore, as the corner height $H_{141}$ increases, charge confinement in the Z-direction improves. The improved charge confinement is achieved without increasing the degree of waviness of the channel material 118. By way of non-limiting example, the height $H_{140}$ of the charge confinement region 140 may be within a range of from about 10 nm to about 27 nm, such as between about 10 nm and about 14 nm, between about 14 and about 20 nm, between about 20 nm and about 24 nm, or between about 24 nm and about 27 nm.

The corner height of the region 141 may be responsive to dimensions (e.g., widths, heights) of surrounding materials. For example a width $W_{112}$ of the oxide material 112, including a width $W_{112a}$ of the first region 112a, a width $W_{112b}$ of the second region 112b, and a width $W_{112c}$ of the third region 112c, may be selected to achieve the desired performance requirements of the storage node 114 of the pillar 119. By way of non-limiting example, the width $W_{112}$ of the oxide material 112 may be within a range of from about 6 nm to about 12 nm, such as between about 6 nm and about 8 nm, between about 8 nm and about 10 nm, or between about 10 nm and about 12 nm. For example, the width $W_{112a}$ of the first region 112a and the width $W_{112c}$ of the third region 112c may individually exhibit a thickness of between about 2 nm and about 6 nm, such as about 2 nm or about 4 nm, and the width $W_{112b}$ of the second region 112b may exhibit a thickness of between about 2 nm and about 10 nm. As shown in FIG. 1D, the width $W_{112a}$ of the first region 112a corresponds to a width of the recess 132, and a combined width $W_{112a}$ of the first region 112a and the width $W_{112b}$ of the second region 112b corresponds to the width $W_{147}$ of the lateral segment 147. In some embodiments, the first region 112a may exhibit a thickness of about 2 nm and the second region 112b may exhibit a thickness of about 5 nm. Therefore, the combined thickness of the first region 112a and the second region 112b (e.g., the width $W_{147}$) is about 7 nm. In other embodiments, the first region 112a may exhibit a thickness of about 4 nm and the second region 112b may exhibit a thickness of about 5 nm for a combined thickness of about 9 nm. Since the width $W_{112c}$ of the third region 112c may be substantially equal to or greater than the width $W_{112a}$ of the first region 112a in some instances, a combined thickness of the second region 112b and the third region 112c may be between about 7 nm and about 10 nm.

One or more of the height $H_{108}$ (FIG. 1A) of the dielectric materials 108 and the height $H_{106}$ of the conductive materials 106 may be selected to achieve the desired performance requirements of the charge confinement region 140 of the storage node 114. By way of non-limiting example, the height $H_{108}$ of the dielectric materials 108 and the height $H_{106}$ of the conductive materials 106 may individually be within a range of from about 15 nm to about 30 nm, such as between about 20 nm and about 24 nm, between about 24 nm and about 27 nm, or between about 27 nm and about 30 nm. In some embodiments, the height $H_{108}$ of the dielectric materials 108 is about 20 nm and the height $H_{106}$ of the conductive materials 106 is about 29 nm. Further, the height $H_{140}$ of the charge confinement region 140 is relatively less than the height $H_{106}$ of the conductive materials 106. In other words, a ratio of $H_{140}$:$H_{106}$ is less than 1.0. For example, the $H_{140}$ of the charge confinement region 140 may be between about 10 nm and about 25 nm and the $H_{106}$ of the conductive materials 106 may be between about 25 nm and about 30 nm. In some embodiments, the $H_{106}$ of the conductive materials 106 is greater than the $H_{140}$ of the charge confinement region 140 by between about 5 nm and about 14 nm. Furthermore, the ratio of the height $H_{140}$ of the charge confinement region 140 and the height $H_{106}$ of the conductive materials 106 may be between about 0.3 and about 0.9, such as between about 0.4 and about 0.7.

Further, a pitch between horizontally adjacent pillars 119 may be within a range of from about 50 nm to about 200 nm, such as from about 50 nm to about 100 nm, from about 100 nm to about 150 nm, or from about 150 nm to about 200 nm. In some embodiments, a critical dimension (CD) of the individual pillars 119 in a horizontal direction is within a range of from about 20 nm to about 200 nm, such as from about 20 nm to about 50 nm, from about 50 nm to about 100 nm, from about 100 nm to about 150 nm, or from about 150 nm to about 200 nm, for example. In some embodiments, the height $H_{140}$ of the charge confinement region 140 may be about 21.7 nm with about 2 nm of waviness, a final pillar CD of about 118 nm, and a $H_{140}$:$H_{106}$ ratio of about 0.75. In other embodiments, the height $H_{140}$ may be about 20.7 nm with about 4 nm waviness, a final pillar CD of about 122 nm, and a $H_{140}$:$H_{106}$ ratio of about 0.71. In additional embodiments, the height $H_{140}$ may be about 15.7 nm with about 2 nm of waviness, a final pillar CD of about 116 nm, and a $H_{140}$:$H_{106}$ ratio of about 0.54. In yet other embodiments, the height $H_{140}$ may be about 13.5 nm with about 4 nm of waviness, a final pillar CD between about 110 nm and about 125 nm, (e.g., about 112 nm), and a $H_{140}$:$H_{106}$ ratio of about 0.47. Accordingly, an increase in the waviness of the channel material 118 may result in a reduced height $H_{140}$ of the charge confinement region 140 and associated $H_{140}$:$H_{106}$ ratio, as well as a reduced final pillar CD, in some instances. For example the $H_{140}$:$H_{106}$ ratio may be reduced from about 0.8 to less than about 0.7, or even less than 0.6, as a result of increasing the channel waviness. Increasing a dimension (e.g., a width) of recessed regions of initial sacrificial materials (e.g., tier nitride materials) in the X-direction may result in a reduced height $H_{140}$ of the charge confinement region 140 in the Z-direction.

Charge trap performance of the charge confinement region 140 of the storage node 114 may also be responsive to dimensions (e.g., width) of additional materials of the pillar 119. For example, a width $W_{114}$ of the storage node 114 and/or a width $W_{118}$ of the channel material 118 may be selected to achieve the desired performance requirements of the storage node 114. By way of non-limiting example, the width $W_{114}$ of the storage node 114 may be within a range of from about 5 nm to about 12 nm, such as between about 5 nm and about 10 nm, between about 5 nm and about 9 nm, between about 7 nm and about 12 nm, or between about 6 nm and about 12 nm. In some embodiments, the storage node 114 is formed at a thickness of about 6 nm. The width $W_{118}$ of the channel material 118 may, for example, be within a range of from about 5 nm to about 10. The thicknesses of the insulative material 130, including the width $W_{130a}$ of the first region 130a and a width $W_{130b}$ of the second region 130b, may vary in the vertical direction, as discussed above, and be responsive to dimensions (e.g., widths, heights) of respective materials of the pillar 119 and the stack 104 (FIG. 1A). For example, the width $W_{130a}$ of the first region 130a may be responsive to the width $W_{112a}$ of the first region 112a within the recess 132 (e.g., between about 0.5 nm and about 4 nm). The width $W_{130b}$ of the second region 130b may be in a range of from about 2 nm and about 50 nm, for example. One of ordinary skill in the art will understand that selective placement (e.g., thicknesses) of materials as well as formation of such materials, including types of materials, processing conditions (e.g., temperature, processing times, ratios of processing agents) and the like, may be selected to achieve the desired performance requirements by varying the height $H_{140}$ of the charge confinement region 140 in the Z-direction, which variables may be adjusted (e.g., tuned) to achieve improved performance properties of the memory cells 120 of the pillar 119, while substantially reducing (e.g., substantially minimizing) lateral charge migration and cell-to-cell coupling between adjacent charge confinement regions 140 controlled by neighboring portions of the conductive materials 106.

Accordingly, an electronic device comprises a stack of alternating dielectric materials and conductive materials, a pillar region extending vertically through the stack, an oxide material within the pillar region and laterally adjacent to the dielectric materials and the conductive materials of the stack, and a storage node laterally adjacent to the oxide material and within the pillar region. A charge confinement region of the storage node is in horizontal alignment with the conductive materials of the stack. A height of the charge confinement region in a vertical direction is less than a height of a respective, laterally adjacent conductive material of the stack in the vertical direction.

Accordingly, another electronic device comprises a stack of alternating dielectric materials and conductive materials, and one or more pillars in the stack. The one or more pillars comprise an oxide material laterally adjacent to the dielectric materials and the conductive materials, and a storage node comprising a charge confinement region and peripheral regions. The charge confinement region is between vertically adjacent portions of the oxide material and laterally adjacent to the conductive materials of the stack. The one or more pillars comprise a tunnel material laterally adjacent to the storage node, and a channel material laterally adjacent to the tunnel material.

The electronic device 100 of FIG. 1A may be formed as shown in FIGS. 2A through 2E, which are cross-sectional views of portions of the electronic device 100 during fabrication. The cross-sectional views in FIGS. 2A through 2E are enlarged views corresponding to the boxed region in FIG. 1A. For simplicity, however, only a portion of the electronic device 100 is illustrated in FIGS. 2A through 2E, with the understanding that the remaining portion of the electronic device 100 is symmetric about the central axis 150.

Figure 2A:
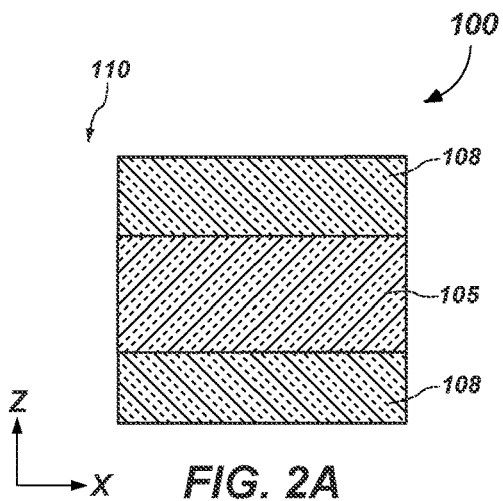
FIGS. 2A through 2E are cross-sectional views at various stages of forming the electronic device according to embodiments of the disclosure.

Referring to FIG. 2A, a preliminary stack structure of the stack 104 (FIG. 1A) may be formed to include a vertically alternating (e.g., in the Z-direction) sequence of the dielectric materials 108 and sacrificial materials 105 arranged in tiers. The stack 104 may include multiple tiers of the alternating sacrificial materials 105 and the dielectric materials 108, such as greater than or equal to 50 tiers, greater than or equal to 100 tiers, greater than or equal to 200 tiers, or greater than or equal to 500 tiers. The tiers of the stack 104 may be formed at a pitch of from about 20 nm to about 50 nm, such as from about 35 nm to about 50 nm, from about 35 nm to about 45 nm, from about 35 nm to about 40 nm, from about 40 nm to about 50 nm, or from about 45 nm to about 50 nm. In some embodiments, the tiers are formed at a pitch of about 45 nm. In other embodiments, the tiers are formed at a pitch of about 49 nm.

Each of the tiers may include individual portions of the sacrificial materials 105 and individual portions of the dielectric materials 108 vertically adjacent to the sacrificial materials 105. The dielectric materials 108 may be formed of and include silicon oxide, silicon nitride, silicon oxynitride, or other dielectric material. In some embodiments, each of the dielectric materials 108 is formed of and includes silicon dioxide (Sift). The dielectric materials 108 may each be substantially planar, and may each independently exhibit any desired thickness. In addition, each of the dielectric materials 108 may be substantially the same (e.g., exhibit substantially the same material composition, material distribution, size, and shape) as one another, or at least one of the dielectric materials 108 may be different (e.g., exhibit one or more of a different material composition, a different material distribution, a different size, and a different shape) than at least one other portion of the dielectric materials 108.

The sacrificial materials 105 may each be formed of and include at least one additional dielectric material that may be selectively removed (e.g., selectively etched) relative to the dielectric materials 108. The material of the sacrificial materials 105 may be different than the material of the dielectric materials 108. In some embodiments, each of the sacrificial materials 105 is formed of and includes silicon nitride ($Si_3N_4$). The sacrificial materials 105 may each be substantially planar, and may each independently exhibit any desired thickness. A height of the sacrificial materials 105 may be within a range of between about 20 nm to about 30 nm, such as between about 22 nm and about 27 nm or between about 27 nm and about 29 nm, for example. In some embodiments, a height of the sacrificial materials 105 of the electronic device 100 is relatively less than an initial height of the dielectric materials 108. By way of non-limiting example, the height of the sacrificial materials 105 is about 22 nm and the initial height of the dielectric materials 108 is about 27 nm. In addition, each portion of the sacrificial materials 105 may be substantially the same (e.g., exhibit substantially the same material composition, material distribution, size, and shape) as one another, or at least one portion of the sacrificial materials 105 may be different (e.g., exhibit one or more of a different material composition, a different material distribution, a different size, and a different shape) than at least one other portion of the sacrificial materials 105. The sacrificial materials 105 may serve as sacrificial structures for the subsequent formation of conductive structures, as described in further detail below. The alternating dielectric materials 108 and the sacrificial materials 105 of the preliminary stack structure of the stack 104 (FIG. 1A) may each individually be formed using conventional material processes, which are not described in detail herein. For example, the dielectric materials 108 and the sacrificial materials 105 may each individually be formed through one or more conventional deposition processes (e.g., a PVD process, a CVD process, ALD process, a spin-coating process).

Figure 2B:
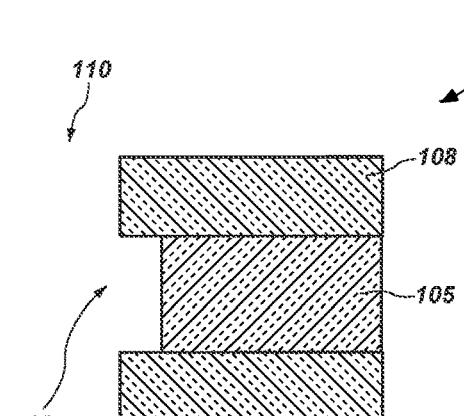

Referring to FIG. 2B, the recess 132 (e.g., an undercut) may be formed in the sacrificial materials 105 adjacent to the opening 110. For example, portions of the sacrificial materials 105 proximate the opening 110 may be removed (e.g., etched) to form the recess 132 such that inner sidewalls of the sacrificial materials 105 are recessed relative to inner sidewalls of the dielectric materials 108. The recess 132 may be formed by conventional techniques, such as by using a selective etch process to remove the desired portion of the sacrificial materials 105 without substantially removing material of the dielectric materials 108. Dimensions of the recess 132 may depend on a desired waviness of the channel material 118, as described in greater detail with reference to FIGS. 1C and 1D. By way of example only, the recess 132 may exhibit dimensions of from about 0.5 nm to about 4 nm, such as from about 0.5 nm to about 1 nm, from about 1 nm to about 2 nm, from about 2 nm to about 3 nm, or from about 3 nm to about 4 nm. In some embodiments, the sacrificial materials 105 may be recessed between about 2 nm and about 4 nm relative to an inner sidewall of a neighboring one of the dielectric materials 108. The dimensions of the recess 132 enable the first region 112a of the oxide material 112 to be formed therein.

Figure 2C:
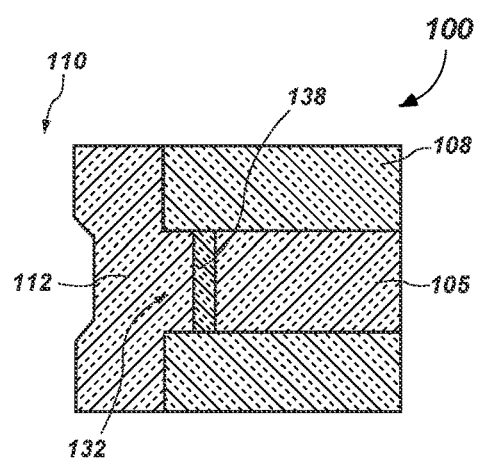

Referring to FIG. 2C, the oxide material 112 may be formed laterally adjacent to the stack 104 (FIG. 1A) and within the opening 110. The oxide material 112 is formed by conventional techniques, such as one or more of in situ growth, CVD, ALD, and PVD using conventional processing equipment. In some embodiments, the oxide material 112 may be formed (e.g., deposited) using a single, continuous ALD process or a single, continuous CVD process. In other embodiments, an initial material (e.g., a silicon nitride material) may be deposited followed by oxidation to form the oxide material 112. The oxide material 112 may be formed of and include, but is not limited to, silicon dioxide, aluminum oxide, hafnium oxide, zirconium oxide, or a combination thereof. The oxide material 112 may, for example, be a charge-blocking material that is conformally formed on the inner sidewalls of each of the dielectric materials 108 and the sacrificial materials 105. The oxide material 112 may be continuous along a vertical distance of the pillar 119 (FIG. 1A). As used herein, the term "continuous" means and includes a material having substantially no interruptions, such as voids, gaps, pinholes, or other openings, therein. In some embodiments, the oxide material 112 is a high quality silicon oxide material, such as an ALD SiOx. For example, the oxide material 112 may be a highly uniform and highly conformal silicon oxide material (e.g., a highly uniform and highly conformal silicon dioxide material) so that voids are not present. In some embodiments, the oxide material 112 may be formed to a substantially equal thickness along the vertical distance of the pillar 119. In some such embodiments, the oxide material 112 conforms to the inner sidewalls of the dielectric materials 108, as well as to the inner sidewalls of the sacrificial materials 105 within the recess 132, such that the oxide material 112 exhibits a topography corresponding to the recessed sacrificial materials 105. In other words, the sidewalls of the oxide material 112 laterally adjacent to the sacrificial materials 105 are recessed, similar to the sacrificial materials 105. In other embodiments, at least a portion of the oxide material 112 exhibits a variable thickness, as described in greater detail with reference to FIGS. 1C and 1D. In some embodiments, an initial width of the oxide material 112 is relatively greater than a final width thereof. By way of non-limiting example, an initial width of the oxide material 112 (e.g., the combined widths of the first region 112a and the second region 112b) corresponding to the lateral segment 147 (FIG. 1D) is between about 8 nm and about 10 nm, such as about 10 nm.

In some embodiments, an additional sacrificial material 138 is formed between the sacrificial materials 105 and the oxide material 112, using a portion of the sacrificial materials 105. For example, portions of the sacrificial materials 105 at the locations that will become the conductive materials 106 (FIG. 2E) may be oxidized to form the additional sacrificial material 138 (e.g., a high-impurity oxidized nitride material). By way of example only, the sacrificial materials 105 may be oxidized in an oxidation process using ionized or radicalized species comprising oxygen. As a result of the oxidation process, portions of the sacrificial materials 105 are converted into an oxidized (e.g., oxide-only) material (e.g., the additional sacrificial material 138), while additional portions of the sacrificial materials 105 remain the original dielectric (e.g., nitride) material. For example, portions of the sacrificial materials 105 laterally adjacent the opening 110 may comprise at least one material that is not an oxide-only material, while additional portions of the sacrificial materials 105 directly laterally adjacent to the oxide material 112 comprise (e.g., consist essentially of, consist of) the oxide-only material of the additional sacrificial material 138. In other embodiments, the oxide material 112 is formed (e.g., deposited) to its desired thickness without oxidizing a portion of the sacrificial materials 105 adjacent to the opening 110.

Figure 2D:
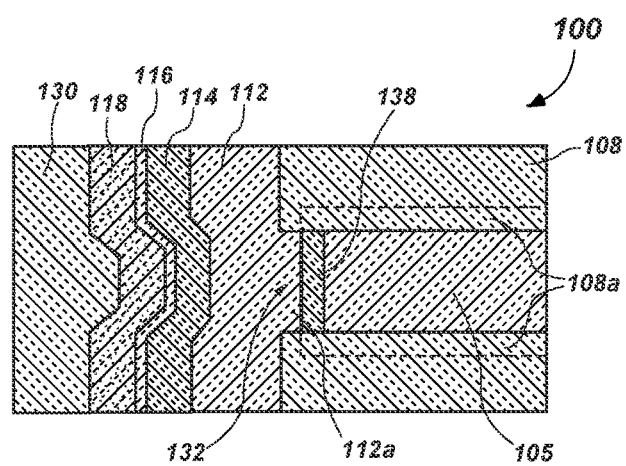

Referring to FIG. 2D, the storage node 114 (e.g., a nitride storage material, a charge storage material) may be formed (e.g., conformally formed) laterally adjacent to the oxide material 112 and the tunnel region 116 may be formed (e.g., conformally formed) laterally adjacent to the storage node 114. The storage node 114 may be continuous along the vertical distance of the pillar 119 (FIG. 1A). In some embodiments, a continuous portion of the oxide material 112 surrounds a continuous portion of the storage node 114 with the oxide material 112 directly contacting each of the storage node 114 and the dielectric materials 108 and the conductive materials 106 of the stack 104 (FIG. 1A). The storage node 114 may include, but is not limited to, silicon nitride, silicon oxynitride, or a combination thereof. A portion of the storage node 114 may function as a charge trap region (e.g., the charge confinement region 140) during use and operation of the electronic device 100. The tunnel region 116 may include, but is not limited to, silicon dioxide, aluminum oxide, hafnium oxide, zirconium oxide, or a combination thereof. The tunnel region 116 may form a barrier between the storage node 114 and the channel material 118. In some embodiments, the tunnel region 116 may be formed at a smaller relative thickness (e.g., between about 2 nm and about 6 nm) than each of the storage node 114 and the channel material 118. In some embodiments, the tunnel region 116 may be formed as a so-called "oxide-nitride-oxide" (ONO) structure (e.g., an interlayer poly dielectric structure), which may be referred to in the art as a barrier engineered material.

The channel material 118 may be formed (e.g., conformally formed) along inner sidewalls of the tunnel region 116 and over an exposed upper surface of the base material 102 (FIG. 1A). The material of the channel material 118 may be doped polysilicon, undoped polysilicon, or other channel material. In some embodiments, the channel material 118 is formed of polysilicon. The storage node 114, the tunnel region 116, and the channel material 118 are formed by conventional techniques, such as by CVD or ALD. Each of the storage node 114, the tunnel region 116, and the channel material 118 conforms to the sidewalls of the adjacent materials, such that a corresponding recess is formed in sidewalls of each of the storage node 114, the tunnel region 116, and the channel material 118. In other words, the topology formed by the recesses 132 in the sacrificial material 105 is transferred to subsequently-formed materials. By forming the recesses 132 in the sacrificial materials 105 prior to replacing the sacrificial materials 105 with the conductive materials 106, the waviness of the storage node 114, the tunnel region 116, and the channel material 118 may be tailored in order to reduce the vertical distance of individual charge confinement regions 140 within the storage node 114 without segmenting (e.g., vertically dividing) the storage node.

The insulative material 130 may be formed laterally adjacent to the channel material 118. The insulative material 130 may substantially completely fill a remainder of the opening 110 (FIG. 2C) (e.g., a substantially cylindrical opening) so as to substantially fully extend between sidewalls of the channel material 118. The insulative material 130 may be formed of and include, but is not limited to, an oxide (e.g., silicon dioxide (SiO2)), a nitride (e.g., silicon nitride (SiN)), or an oxynitride. In some embodiments, the insulative material 130 is a high quality silicon oxide material, such as an ALD SiOx. For example, the insulative material 130 may be a highly uniform and highly conformal silicon oxide material (e.g., a highly uniform and highly conformal silicon dioxide material) so that voids are not present in the central portion. In particular, the insulative material 130 may be formulated to be formed in high aspect ratio (HAR) openings, such as a HAR of at least about 20:1, at least about 50:1, at least about 100:1, or at least about 1000:1, without forming voids. In other embodiments, the insulative material 130 may be formed of and include an air-filled void. The insulative material 130 may be formed using one or more conventional conformal deposition processes, such as one or more of a conventional conformal CVD process or a conventional ALD process. Alternatively, the insulative material 130 may be formed using one or more conventional non-conformal deposition processes, such as one or more of a conventional PVD process (e.g., a conventional radio frequency PVD (RFPVD) process), or a conventional non conformal CVD process.

Portions of the storage node 114, the tunnel region 116, the channel material 118, and the insulative material 130 vertically extending beyond a plane of the upper surface of the stack 104 (FIG. 1A) may subsequently be removed, such as by CMP or etching. Additionally, portions of the insulative material 130 (FIG. 1A) may be selectively removed, such as by etching, to recess the insulative material 130 from an uppermost surface of the stack 104 (FIG. 1A) and may be below an upper surface of the uppermost conductive material 106B, as shown in FIG. 1A. In some embodiments, upper surfaces of the storage node 114, the tunnel region 116, and the channel material 118 may be substantially coplanar with one another. Formation of the plug material 124, the data line 126, and the cap material 128 (FIG. 1A) may each individually be formed using conventional material processes, which are not described in detail herein. In some embodiments, sacrificial portions 108a of the dielectric materials 108 may be adjacent to the sacrificial materials 105. The sacrificial portions 108a (shown by the dashed lines in FIG. 2D) may be designated for subsequent removal. At least portions (e.g., outer portions) of the first region 112a of the oxide material 112 adjacent to the additional sacrificial material 138 may also be designated as sacrificial portions of the oxide material 112 in the embodiment of FIG. 2D. In some embodiments, the oxide material 112 may be reduced by about 2 nm to about 4 nm, for example.

Figure 2E:
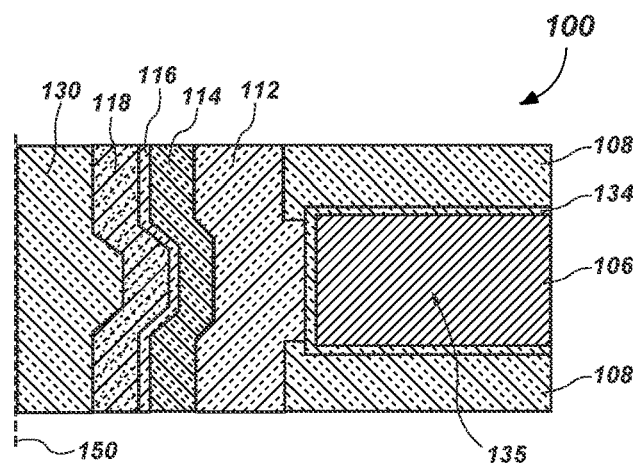

Referring to FIG. 2E, the sacrificial materials 105 may be substantially removed through slots (not shown) extending vertically through the stack 104 (FIG. 1A) through a so-called "replacement gate" or "gate last" process. By way of non-limiting example, the sacrificial materials 105 may be removed by exposing the sacrificial materials 105 to at least one wet etchant comprising one or more of phosphoric acid, sulfuric acid, hydrochloric acid, nitric acid, or another material. In some embodiments, the sacrificial materials 105 are removed by exposing the sacrificial materials 105 to a so-called "wet nitride strip" comprising a wet etchant comprising phosphoric acid. In some instances, portions of the dielectric materials 108 (e.g., the sacrificial portions 108a (FIG. 2D)) exposed following the removal of the sacrificial materials 105 may also be removed such that a final dimension (e.g., final height) of the dielectric materials 108 is relatively less than an initial dimension (e.g., initial height) of the dielectric materials 108. Accordingly, a final height of the dielectric materials 108 may be achieved to maintain structural support and cell performance by forming the dielectric materials 108 to a greater initial height to offset potential reduction in materials (e.g., between about 2 nm and about 7 nm) during processing.

The oxidized material of the additional sacrificial material 138 (FIG. 2D), if present, may also be removed (e.g., substantially entirely removed) such that the electronic device 100 is substantially devoid (e.g., substantially absent) of the additional sacrificial material 138, which may contain phosphorus-containing species, between the oxide material 112 and the conductive materials 106. In other words, the electronic device 100 may be substantially devoid of one or more phosphorus-containing species (e.g., phosphorus atoms, phosphorus-containing molecules, phosphide ions, phosphorus-containing ions). The additional sacrificial material 138 may be removed during the same material removal act as that of the sacrificial materials 105 or, alternatively, using one or more additional material removal acts. Absence of oxidized nitride materials (e.g., the additional sacrificial material 138) between the oxide material 112 and the conductive materials 106 in the electronic device 100 provides improved structural and insulative properties, such as lower leakage current, higher program and erase cycling capability, and increased data retention reliability for the electronic device 100 (e.g., NAND devices), compared to conventional electronic devices including the oxidized nitride material in such regions. Accordingly, regions previously occupied by a lower-quality oxide material converted from a lower-quality (e.g., CVD) nitride material, such as the additional sacrificial material 138, may now be occupied by material of the wordlines (e.g., the conductive materials 106) to provide lower wordline resistance and increased gate-voltage ramping rates.

As shown in FIG. 2E, after removal of the sacrificial materials 105 and the additional sacrificial material 138 (FIG. 2D), the conductive materials 106 may be formed in openings between vertically neighboring portions of the dielectric materials to form tiers of the dielectric materials 108 and the conductive materials 106 of the stack 104 (FIG. 1A). The liner material 134 is conformally formed on the dielectric materials 108 and the oxide material 112, and the conductive materials 106 are formed in the remaining volume of cell openings 135. The liner material 134 and the conductive materials 106 are formed by conventional techniques. In some embodiments, the conductive material 106 is n-doped polysilicon. In other embodiments, the conductive material 106 is tungsten. The liner material 134 substantially surrounds a perimeter of the conductive materials 106 and may be formed of titanium nitride, tungsten, or other conductive material. In some embodiments, the liner material 134 directly contacts each of the oxide material 112, the dielectric materials 108, and the conductive materials 106. For example, the liner material 134 may be in direct physical contact with the oxide material 112, without portions of the additional sacrificial material 138 (FIG. 2D) being present therebetween. In some embodiments, a distance between the inner sidewall of the conductive materials 106 and the central axis 150 of the pillar 119 (FIG. 1A) of the electronic device 100 may be substantially similar to that of conventional pillars. In other embodiments, the distance between the inner sidewall of the conductive materials 106 and the central axis 150 of the pillar 119 may be relatively less than that of conventional pillars, such that a critical dimension (e.g., width) of the pillar 119 may be relatively less than that of conventional pillars at a given width of the opening 110 (FIG. 1C). The height $H_{106}$ of the conductive materials 106 may be substantially the same as the height of the sacrificial materials 105, or may be greater than the height of the sacrificial materials 105 if portions of the dielectric materials 108 are removed during the replacement gate process.

By recessing the sacrificial materials 105 and conformally forming a portion of the pillar materials in the corresponding recesses, increased charge confinement is achieved in the charge confinement regions 140 of the storage node. The charge confinement is achieved without separating the storage node 114 into segments, as is done with conventional electronic devices including 3D NAND polysilicon floating gates, for example. Therefore, the storage node 114 of the electronic devices according to embodiments of the disclosure is continuous in the vertical direction, in contrast to conventional electronic devices in which the storage node is discontinuous (e.g., segmented). As the corner height $H_{141}$ increases, charge confinement in the Z-direction improves, as well as cell-to-cell coupling between adjacent charge confinement regions 140. The improved charge confinement is achieved without increasing a degree of waviness of the channel material 118 in the X-direction. For a given channel waviness in the X-direction, charge confinement in the Z-direction and cell-to-cell coupling are improved. The charge confinement may be improved without also decreasing a final thickness of the oxide material 112. Since a portion of the as-formed oxide material 112 is removed during the gate replacement process, a final thickness of the oxide material 112 may be maintained even though the oxide material 112 is initially formed to a greater thickness.

Accordingly, a method of forming an electronic device comprises forming pillar openings in a stack of alternating dielectric materials and nitride materials, removing portions of the nitride materials of the stack adjacent to the pillar openings to form recessed regions of the nitride materials, forming an oxide material laterally adjacent to the dielectric materials of the stack and within the recessed regions of the nitride materials, and forming a charge storage material laterally adjacent to the oxide material. The charge storage material comprises charge confinement regions in horizontal alignment with the nitride materials of the stack. The method comprises removing additional portions of the nitride materials of the stack to form cell openings between the dielectric materials of the stack, and forming conductive materials in the cell openings. A height of the conductive materials in a vertical direction is greater than a height of the charge confinement regions in the vertical direction.

An electronic device 100' according to other embodiments of the disclosure may be formed as shown in FIGS. 3A through 3F, which are cross-sectional views of portions of the electronic device 100' during fabrication. The cross-sectional views in FIGS. 3A through 3F are enlarged views of the boxed region in FIG. 1A. Unless otherwise specified, the material types, material thicknesses, etc. of the electronic device 100' are as described above for FIGS. 2A through 2E. At the processing stage depicted in FIG. 3A the electronic device 100' may be substantially similar to the electronic device 100 at the processing stage depicted in FIG. 2A. The tiers of the stack 104 (FIG. 1A) may include the sacrificial materials 105 and the dielectric materials 108 vertically adjacent to the sacrificial materials 105. The electronic device 100' differs from the electronic device 100 in the initial dimensions (e.g., initial heights) of the dielectric materials 108 and the sacrificial materials 105. For example, an initial height of the dielectric materials 108 of the electronic device 100' may be relatively less than that of the dielectric materials 108 of the electronic device 100 of FIG. 2A, and a height of the sacrificial materials 105 of the electronic device 100' may be relatively greater than that of the sacrificial materials 105 of the electronic device 100. Further, the height of the sacrificial materials 105 of the electronic device 100' may be relatively greater than the initial height of the dielectric materials 108. By way of non-limiting example, the height of the sacrificial materials 105 is about 27 nm and the initial height of the dielectric materials 108 is about 22 nm.

Figure 3A:
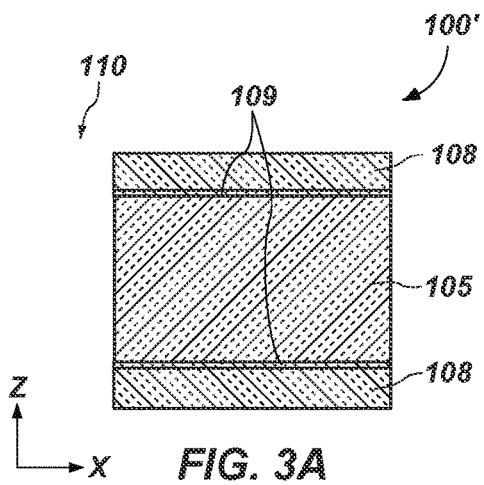
FIGS. 3A through 3F are cross-sectional views at various stages of forming the electronic device according to other embodiments of the disclosure.

As shown in FIG. 3A, a barrier material 109 (e.g., an interface material) may, optionally, be formed adjacent to the dielectric materials 108. In some embodiments, the barrier material 109 may be formed during formation of the dielectric materials 108 and the sacrificial materials 105. The barrier material 109 may be formed between (e.g., directly between) the dielectric materials 108 and the sacrificial materials 105. The barrier material 109 may be formed of and include one or more insulative (e.g., dielectric) materials, such as a nitride material (e.g., a silicon nitride), an oxide material (e.g., a silicon oxide (e.g., silicon dioxide)), an oxynitride material (e.g., silicon oxynitride), and be formulated as an etch stop material, although other materials may be contemplated. By way of non-limiting example, the barrier material 109 may include a carbon-doped nitride material (e.g., a carbon-doped silicon nitride) or a carbon-doped oxide material (e.g., a carbon-doped silicon oxide). The dielectric materials 108, for example, may be doped in situ with at least one dopant (e.g., carbon) within regions immediately adjacent to an interface between the dielectric materials 108 and the sacrificial materials 105 without being formed in regions remote from the interface therebetween. If present, the barrier material 109 includes a material composition that is different than a material composition of the dielectric materials 108 and the sacrificial materials 105 of the stack 104 (FIG. 1A) and different than a material composition of the oxide material 112 (FIG. 3C), so that the barrier material 109 is selectively removable (e.g., selectively etchable) relative to each of the dielectric materials 108, the sacrificial materials 105, and the oxide material 112. In other words, the sacrificial materials 105 may be selectively removable relative to the barrier material 109. The doped regions (e.g., more heavily doped regions) of the barrier material 109 formed along outer surfaces of the dielectric materials 108 may exhibit a significantly reduced wet etch rate relative to that of surrounding materials (e.g., remaining portions of the dielectric materials 108). Accordingly, portions of the oxide material 112 may subsequently be removed without substantially removing the doped regions of the dielectric materials 108. In some embodiments, portions (e.g., between about 2 nm and about 6 nm) of the oxide material 112 may be selectively removed (e.g., selectively reduced) without substantially removing the dielectric materials 108. The barrier material 109 may substantially shield (e.g., substantially protect) the dielectric materials 108 during material removal processes of the oxide material 112. In some embodiments, the barrier material 109 may not be substantially completely removed, such that at least a portion of the barrier material 109 is present in the electronic device 100'.

Figure 3B:
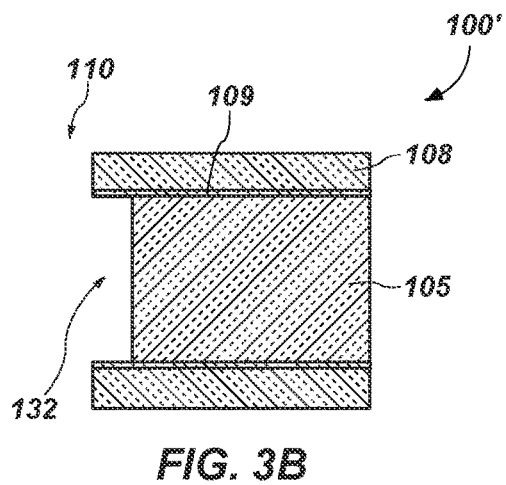

Referring to FIG. 3B, the recess 132 may be formed adjacent to the sacrificial materials 105 such that inner sidewalls of the sacrificial materials 105 are recessed relative to inner sidewalls of the dielectric materials 108. Dimensions of the recess 132 may depend on a desired waviness of the channel material 118 and allow the first region 112a of the oxide material 112 to be formed therein.

Figure 3C:
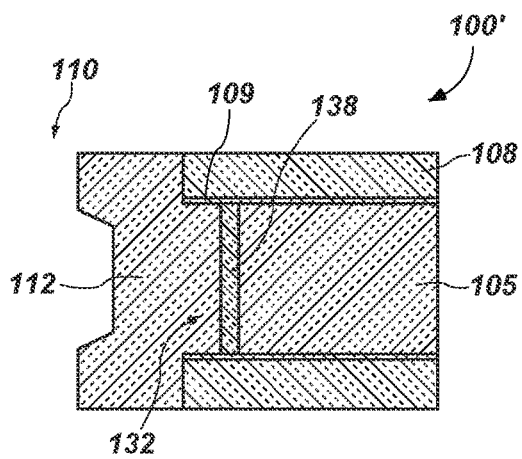

Referring to FIG. 3C, the oxide material 112 may be formed laterally adjacent to the stack 104 (FIG. 1A) within the opening 110. The additional sacrificial material 138 may be formed between the sacrificial materials 105 and the oxide material 112, using an oxidized portion of the sacrificial materials 105, during formation of the oxide material 112. The oxide material 112 conforms to the inner sidewalls of the dielectric materials 108, as well as to the inner sidewalls of the sacrificial materials 105 within the recess 132, such that a corresponding recess is formed along the inner sidewalls of the oxide material 112. The electronic device 100' differs from the electronic device 100 in the configuration of initial dimensions (e.g., initial widths) of the oxide material 112 during formation thereof, which initial widths may be greater than that in the electronic device 100. By way of non-limiting example, an initial width of the oxide material 112 (e.g., the combined widths of the first region 112a and the second region 112b) corresponding to the lateral segment 147 (FIG. 1D) is between about 8 nm and about 10 nm, such as about 8 nm. Accordingly, the corresponding recess of the inner sidewalls of the oxide material 112 may be increased in the vertical direction (e.g., the Z-direction) and/or be further increased in the horizontal direction (e.g., the X-direction) in the embodiment of FIG. 3C relative to the corresponding recess in the embodiment of FIG. 2C. The increased height and/or increased width of the corresponding recess in the inner sidewalls of the oxide material 112 may be the result of the height of the sacrificial materials 105 of the electronic device 100' being relatively greater than an initial height of the dielectric materials 108 relative to the electronic device 100. The greater relative width of the oxide material 112 (e.g., the first regions 112a (FIG. 1C)) allows for portions of the oxide material 112 to be subsequently removed following removal of the sacrificial materials 105.

Figure 3D:
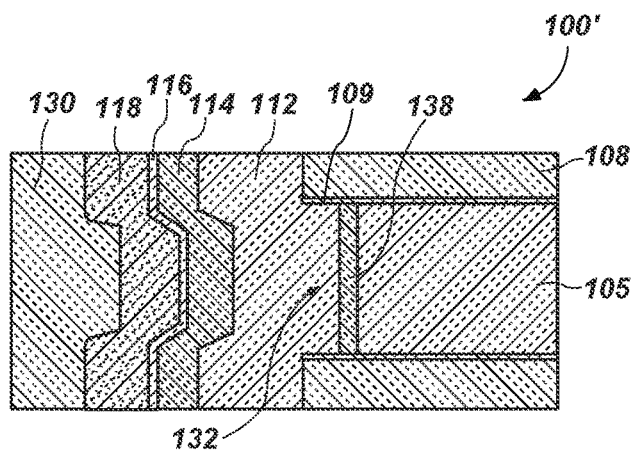

Referring to FIG. 3D, the storage node 114 may be formed laterally adjacent to the oxide material 112 and the tunnel region 116 may be formed laterally adjacent to the storage node 114. The channel material 118 may be formed along inner sidewalls of the tunnel region 116 and over an exposed upper surface of the base material 102 (FIG. 1A), and the insulative material 130 may be formed laterally adjacent to the channel material 118. Each of the storage node 114, the tunnel region 116, and the channel material 118 conforms to the adjacent materials, such that a corresponding recess is formed in each of the storage node 114, the tunnel region 116, and the channel material 118. However, the corresponding recesses within the materials may exhibit an increased height and/or an increased width in the embodiment of FIG. 3D relative to the corresponding recesses in the embodiment of FIG. 2D. Since the electronic device 100' differs from the electronic device 100 in the configuration of initial dimensions (e.g., initial widths) of the oxide material 112 during formation thereof, the region 141 (FIG. 1D) may be increased, the height $H_{140}$ (FIG. 1D) of the charge confinement region 140 may be decreased, and a height of the first regions 130a (FIG. 1A) of the insulative material 130 may be decreased. The reduced height and/or the increased width of the first regions 130a of the insulative material 130 may be the result of an increase in a height of the region 141 (FIG. 1D) of the second region 112b (FIG. 1D) that facilitates a corresponding reduction in a height of the charge confinement region 140 (FIG. 1D) of the storage node 114. Accordingly, the differing initial thicknesses of the dielectric materials 108 and the sacrificial materials 105, coupled with the differing initial thickness of the oxide material 112, in the electronic device 100' may result in the increased height of the region 141 of the second region 112b. In turn, the increased height of the region 141 facilitates a corresponding reduced height of the charge confinement region 140 of the storage node 114.

Figure 3E:
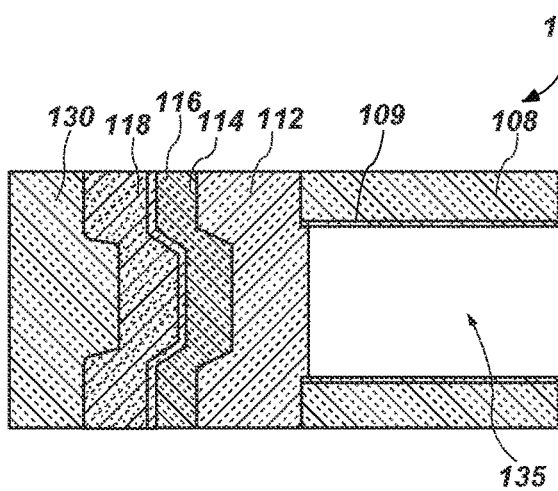

Referring to FIG. 3E, after removal of the sacrificial materials 105 (FIG. 3D), the additional sacrificial material 138, and sacrificial portions of the first region 112a, dimensions (e.g., heights, widths) of the cell openings 135 of the electronic device 100' may be substantially similar to that of the electronic device 100. Accordingly, final dimensions (e.g., final heights, final widths) of at least some of the materials (e.g., the sacrificial materials 105, the dielectric materials 108, the oxide material 112) may be substantially similar to that of the materials of the electronic device 100, which differing initial dimensions, as well as formation of the barrier material 109 (e.g., allowing removal of additional portions of the oxide material 112 through the cell openings 135) facilitated enhanced results (e.g., further height reductions in the charge confinement region 140 (FIG. 1D)) relative to the embodiment of FIG. 2E.

Figure 3F:
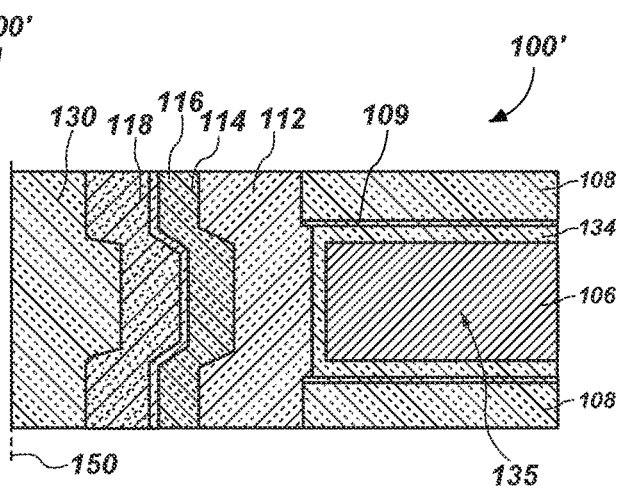

Referring to FIG. 3F, the conductive materials 106 may be formed between vertically neighboring portions of the dielectric materials 108 at locations corresponding to the locations of the sacrificial materials 105 (FIG. 3D) to form tiers of the dielectric materials 108 and the conductive materials 106 of the stack 104 (FIG. 1A). The liner material 134 is conformally formed on the dielectric materials 108 and the oxide material 112, and the conductive materials 106 are formed in the remaining volume of the cell openings 135. The electronic device 100' is substantially devoid (e.g., substantially absent) of the additional sacrificial material 138. In some such embodiments, a horizontal distance between the inner sidewall of the conductive materials 106 and the central axis 150 of the pillar 119 (FIG. 1A) of the electronic device 100' is substantially similar to that of the electronic device 100. For example, a width of the lateral segment 147 (FIG. 1D) of the electronic device 100' is substantially similar to that of the electronic device 100. In some embodiments, a distance between the inner sidewall of the conductive materials 106 and the central axis 150 of the pillar 119 (FIG. 1A) of the electronic device 100' may be substantially similar to that of pillars in conventional electronic devices. In other embodiments, the distance between the inner sidewall of the conductive materials 106 and the central axis 150 of the pillar 119 may be relatively less than that of pillars in conventional electronic devices, such that a critical dimension (e.g., width) of the pillar 119 according to embodiments of the disclosure may be relatively less than that of conventional pillars, which may result in a decreased width of the opening 110 (FIG. 3C).

Accordingly, another method of forming an electronic device comprises forming a stack comprising vertically alternating dielectric materials and nitride materials, forming pillar openings in the stack, forming recesses in the nitride materials adjacent to the pillar openings, forming an oxide material laterally adjacent to the dielectric materials and in the recesses of the nitride materials, and forming a storage node laterally adjacent to the oxide material. The storage node comprises charge confinement regions in horizontal alignment with the nitride materials of the stack without being in horizontal alignment with the dielectric materials of the stack. The method comprises selectively removing portions of the oxide material without substantially removing portions of the dielectric materials of the stack.

The charge confinement regions 140 in the vertical direction of the storage node 114 of the pillar 119 of the electronic devices 100, 100' function to reduce lateral charge migration and to electrically isolate the storage nodes 114 in horizontal alignment with a respective one of the conductive materials 106 from adjacent storage nodes 114 of vertically adjacent ones of the conductive materials 106. For example, the waviness of the channel material 118 reduces the vertical distance of the charge confinement region 140 within the storage node 114 of the pillar 119. The presence of the oxide material 112 (e.g., the first region 112a) in the recessed regions of the conductive materials 106, in combination with the varying thicknesses of the oxide material 112, changes the configuration of the stack 104 of the electronic devices 100, 100'. For example, the differing (e.g., greater) thicknesses of the oxide material 112 horizontally adjacent to the dielectric materials 108 relative to the thickness of the oxide material 112 horizontally adjacent to the conductive materials 106 and the liner material 134 further reduces the vertical distance of the charge confinement region 140 to electrically isolate the memory cells 120 (FIG. 1A) (e.g., NAND memory cells) controlled by neighboring portions of the conductive materials 106, even while the pitch and CD of the pillars 119 continue to be reduced and while the pitch of the tiers continues to be reduced. Therefore, lateral charge migration is reduced and the memory cells 120 are further physically and/or electrically isolated from one another by the differing (e.g., greater) thickness of the oxide material 112 without the need to segment (e.g., vertically divide) the storage node 114.

Accordingly, selective placement (e.g., thicknesses) of materials as well as formation of such materials, including types of materials, processing conditions (e.g., temperature, processing times, ratios of processing agents) and the like, may be utilized to achieve the desired performance requirements by varying a height of the charge confinement region 140 in the Z-direction, as well as the ratio of the height of the charge confinement region 140 and the height of the conductive materials 106, which variables may be tailored (e.g., tuned) to achieve improved performance properties of the storage node 114 of the pillar 119, while substantially reducing (e.g., substantially minimizing) lateral charge migration and coupling between the memory cells 120 that are controlled by vertically neighboring portions of the conductive materials 106.

Figure 4A:
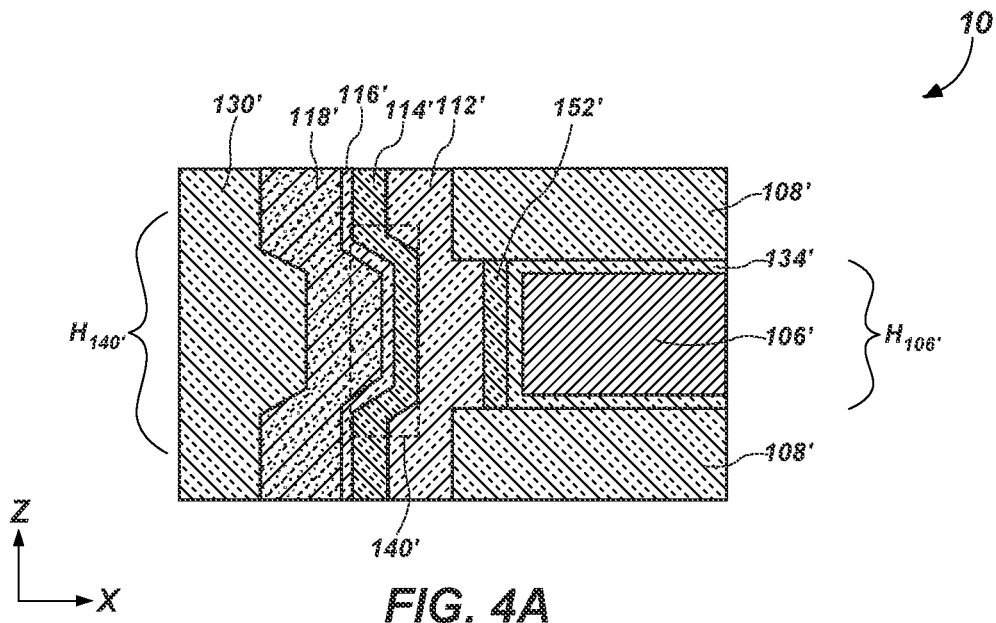
FIGS. 4A and 4B are cross-sectional views of conventional electronic devices at a similar processing stage as that of FIGS. 2E and 3F.

In contrast, a height of a charge confinement region 140' of a storage node 114' in the vertical direction (e.g., the Z-direction) in conventional electronic devices may be substantially equal to or, alternatively, relatively greater than (e.g., extend above, extend below) a height of conductive materials 106' in the vertical direction. In such structures, vertically neighboring portions of the conductive materials 106' may be susceptible to lateral charge migration and cell-to-cell coupling with one another during subsequent process acts and/or during use and operation of conventional electronic devices. As shown in FIG. 4A, which is a cross-sectional view of a conventional electronic device 10 at a similar stage of fabrication as FIGS. 2E and 3F, the height $H_{140'}$ of a charge confinement region 140' of a storage node 114' may be relatively greater than the height $H_{106'}$ of the conductive materials 106' in the vertical direction, which may result in increased lateral charge migration and increased coupling between the cells controlled by vertically neighboring portions of the conductive materials 106' in the conventional electronic device 10.

Further, a residual tier material 152' (e.g., a high-impurity oxidized nitride material), similar to the additional sacrificial material 138 (FIGS. 2D and 3D), may be present in the conventional electronic devices between the conductive materials 106' and an oxide material 112', such as between and directly contacting a liner material 134' and the oxide material 112'. In other words, the conventional electronic device 10 may be formed by converting portions of tier nitride materials into an oxidized (e.g., oxide-only) material without removing the residual tier material 152' (e.g., oxidized tier nitride materials) in such regions, such that the residual tier material 152' remains between the conductive materials 106' and the oxide material 112'. Accordingly, one or more phosphorus-containing species may be present between the conductive materials 106' and the oxide material 112'. In some instances, a thickness (e.g., width) of the residual tier material 152' in conventional electronic devices may be between about 1 nm and about 3 nm.

Figure 4B:
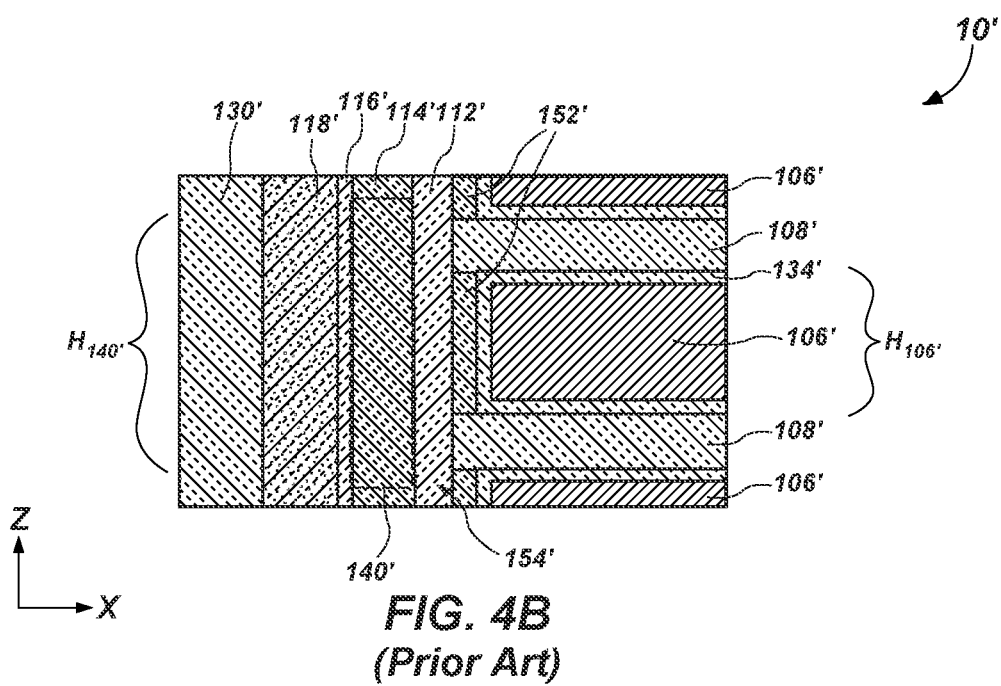

As shown in FIG. 4B, which is a cross-sectional view of a conventional electronic device 10' at a similar stage of fabrication as FIGS. 2E and 3F, the height $H_{140'}$ of the charge confinement region 140' of the storage node 114' may also be relatively greater than the height $H_{106'}$ of the conductive materials 106' in the vertical direction, similar to that of the charge confinement region 140' of the storage node 114' of the conventional electronic device 10 of FIG. 4A. However, the conventional electronic device 10' of FIG. 4B may not include recessed regions of the conductive materials 106', such that materials of the pillars do not vary along a vertical distance of a pillar. In other words, the materials of the pillar exhibit sidewalls having a substantially flat vertical profile without waviness in a channel material 118'. In some instances, a vertical overlap region 154' may be present between the charge confinement region 140' of the storage node 114' and the conductive materials 106'. In other words, the charge confinement region 140' of the storage node 114' of the conventional electronic device 10' may vertically overlap (e.g., extend beyond) upper and lower surfaces of the conductive materials 106', as shown in FIG. 4B, which may result in increased lateral charge migration and coupling between cells controlled by vertically neighboring portions of the conductive materials 106' in the conventional electronic device 10'.

Further, the residual tier material 152' may also be present between the conductive materials 106' and the oxide material 112', such as between and directly contacting the liner material 134' and the oxide material 112'. Accordingly, the conventional electronic device 10' may also be formed by converting portions of tier nitride materials into an oxidized (e.g., oxide-only) material without removing the residual tier material 152' in such regions, such that the residual tier material 152' remains between the conductive materials 106' and the oxide material 112'.

Accordingly, the presence of the residual tier material 152' in the conventional electronic devices 10, 10' may lead to diminished structural and insulative properties in the region between the conductive materials 106' and the oxide material 112' by such regions being occupied by a lower-quality oxide material converted from a lower-quality nitride material of the tier nitride materials. Furthermore, the charge confinement region 140' of the storage node 114' being relatively greater than (e.g., extend above, extend below) a vertical distance of the conductive materials 106' in the conventional electronic devices 10, 10' may lead to lateral charge migration and coupling between cells controlled by the neighboring portions of the conductive materials 106' of the conventional electronic devices, which may result in requirements for increased area (e.g., increased etch profile requirements for pillars or increased height of the conductive materials 106') within a stack structure of the conventional electronic devices.

The electronic devices and methods according to embodiments of the disclosure substantially reduce the occurrence of such unintended coupling between the memory cells 120 (FIG. 1A) controlled by neighboring conductive materials 106 due to the presence of the waviness within the channel material 118 coupled with the differing (e.g., increased) thicknesses of the oxide material 112 in regions horizontally aligned with the dielectric materials 108 of the stack 104. Formation of the recess 132 within the sacrificial materials 105 (e.g., tier nitride materials) according to embodiments of the disclosure may facilitate an increased waviness within the channel material 118 in the X-direction for further charge confinement in the Z-direction during use and operation. In addition, by laterally recessing the sacrificial materials 105, forming a portion of the oxide material 112 within the recess 132, and thereafter removing a portion of the oxide material 112, a distance between the charge confinement region 140 of the storage node 114 and the conductive materials 106 may be decreased relative to a corresponding distance between the charge confinement region 140' of the storage node 114' and the conductive materials 106' of the conventional electronic devices 10, 10'. The decreased distance between the charge confinement region 140 of the storage node 114 and the conductive materials 106 according to embodiments of the disclosure may facilitate circuitry to operate at substantially decreased voltages, substantially reducing leakage and breakdown risks of the oxide material 112. The waviness of the channel material 118 may facilitate formation of the oxide material 112 vertically adjacent to the charge confinement regions 140 of the storage node 114. Accordingly, formation of the waviness within the channel material 118 coupled with the differing thicknesses of the oxide material 112, while maintaining a continuous storage node 114, may also reduce various processing complexities (e.g., complexities associated with properly sizing and aligning various pillars and structures) associated with the formation of conventional wordlines and pillars and associated insulative materials for a conventional electronic device. By varying the initial thicknesses of the dielectric materials 108 and the sacrificial materials 105 during formation, various processing complexities associated with the formation of conventional wordlines and pillars may also be reduced.

Accordingly, the methods as disclosed in FIGS. 2A through 2E may facilitate waviness of the channel material 118 and provide increased initial thicknesses of the oxide material 112 during formation to reduce the charge confinement region 140 of the storage node 114 in the vertical direction. Such methods also facilitate removal of the additional sacrificial material 138 (e.g., oxidized tier nitride materials) for improved structural and insulative properties within the electronic device 100. Additionally, or alternatively, the methods as disclosed in FIGS. 3A through 3F may facilitate a greater waviness of the channel material 118, as well as providing further increased initial thicknesses of the oxide material 112 during formation, portions of which may subsequently be partially selectively removed, for further reduction in the charge confinement region 140 of the storage node 114 within the electronic device 100'. In other words, the embodiments of the disclosure may be combined to further reduce lateral charge migration and to further facilitate an additional separation distance between the charge confinement regions 140 of neighboring memory cells 120 (FIG. 1A) without increasing (e.g., by reducing) the etch profile requirements for the pillars 119.

Figure 5:
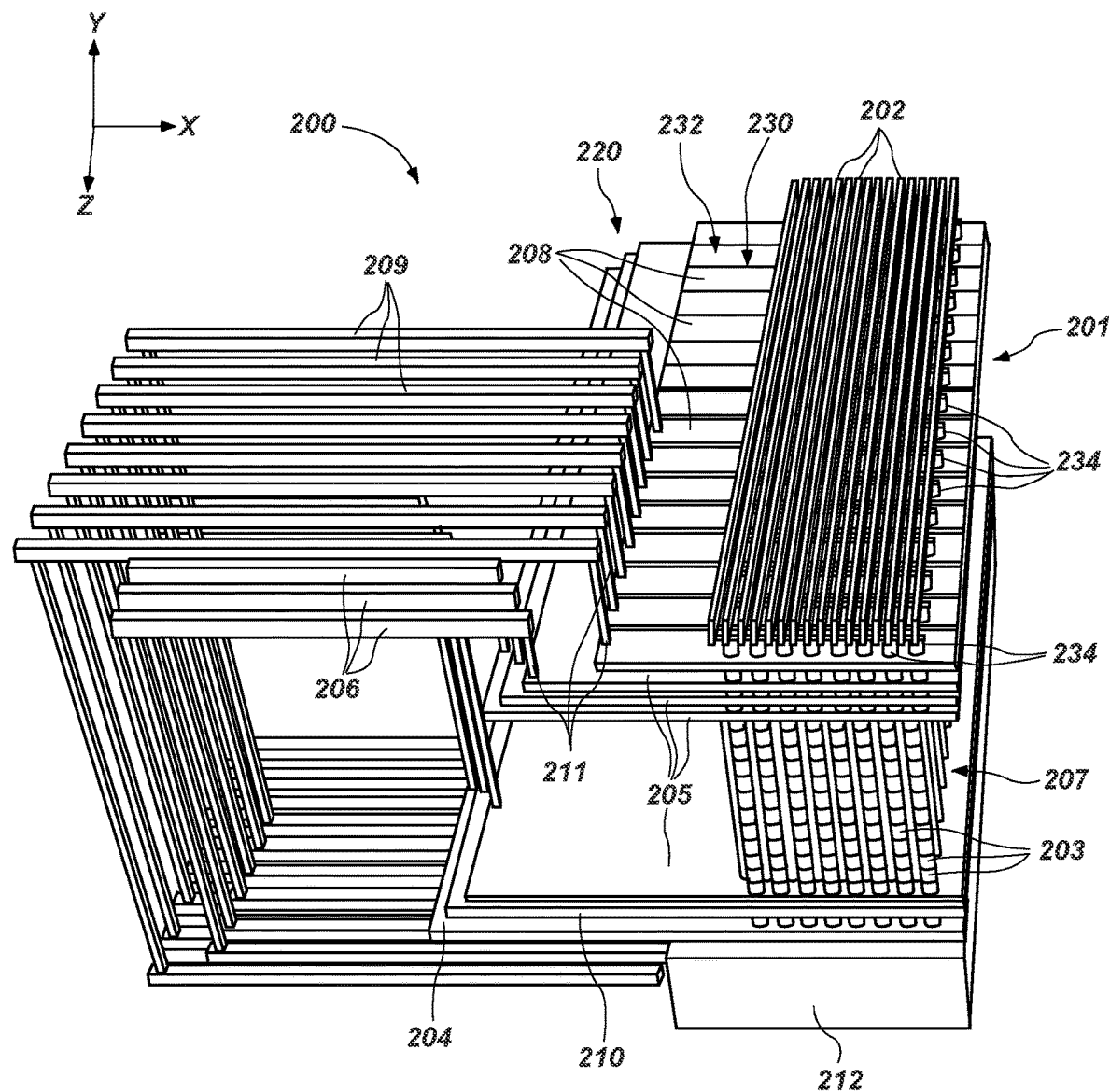
FIG. 5 is a partial cutaway perspective view of an electronic device according to embodiments of the disclosure.

FIG. 5 illustrates a partial cutaway perspective view of a portion of an electronic device 200 (e.g., a microelectronic device, a memory device, such as a 3D NAND Flash memory device) including an electronic structure 201 (e.g., a microelectronic device structure). The electronic device 200 may be substantially similar to the electronic devices 100, 100' previously described with reference to FIGS. 1A through 3F. As shown in FIG. 5, the electronic structure 201 of the electronic device 200 may include a staircase structure 220 defining contact regions for connecting access lines 206 to conductive structures 205 (e.g., corresponding to the conductive materials 106 (FIG. 1A)). The electronic structure 201 may include vertical strings 207 of memory cells 203 (e.g., the memory cell 120 (FIG. 1A)) that are coupled to each other in series. The vertical strings 207 may extend vertically (e.g., in the Z-direction) and orthogonally to conductive lines and the conductive structures 205, such as data lines 202 (e.g., the data line 126 (FIG. 1A)), a source tier 204, the access lines 206, first select gates 208 (e.g., upper select gates, drain select gates (SGDs)) corresponding to the upper conductive materials 106, 106B (FIG. 1A), select lines 209, and a second select gate 210 (e.g., a lower select gate, a source select gate (SGS)) corresponding to the lower conductive materials 106, 106A (FIG. 1A). The select gates 208 may be horizontally divided (e.g., in the Y-direction) into multiple blocks 232 horizontally separated (e.g., in the Y-direction) from one another by slots 230.

Vertical conductive contacts 211 may electrically couple components to each other as shown. For example, the select lines 209 may be electrically coupled to the first select gates 208 and the access lines 206 may be electrically coupled to the conductive structures 205. The electronic device 200 may also include a control unit 212 positioned under the memory array, which may include at least one of string driver circuitry, pass gates, circuitry for selecting gates, circuitry for selecting conductive lines (e.g., the data lines 202, the access lines 206), circuitry for amplifying signals, and circuitry for sensing signals. The control unit 212 may be electrically coupled to the data lines 202, the source tier 204, the access lines 206, the first select gates 208, and the second select gates 210, for example. In some embodiments, the control unit 212 includes CMOS (complementary metal-oxide-semiconductor) circuitry. In such embodiments, the control unit 212 may be characterized as having a "CMOS under Array" ("CuA") configuration.

The first select gates 208 may extend horizontally in a first direction (e.g., the X-direction) and may be coupled to respective first groups of vertical strings 207 of memory cells 203 at a first end (e.g., an upper end) of the vertical strings 207. The second select gate 210 may be formed in a substantially planar configuration and may be coupled to the vertical strings 207 at a second, opposite end (e.g., a lower end) of the vertical strings 207 of memory cells 203.

The data lines 202 (e.g., digit lines, bit lines) may extend horizontally in a second direction (e.g., in the Y-direction) that is at an angle (e.g., perpendicular) to the first direction in which the first select gates 208 extend. Individual data lines 202 may be coupled to individual groups of the vertical strings 207 extending in the second direction (e.g., the Y-direction) at the first end (e.g., the upper end) of the vertical strings 207 of the individual groups. Additional individual group of the vertical strings 207 extending in the first direction (e.g., the X-direction) and coupled to individual first select gates 208 may share a particular vertical string 207 thereof with individual group of vertical strings 207 coupled to an individual data line 202. Thus, an individual vertical string 207 of memory cells 203 may be selected at an intersection of an individual first select gate 208 and an individual data line 202. Accordingly, the first select gates 208 may be used for selecting memory cells 203 of the vertical strings 207 of memory cells 203.

The conductive structures 205 (e.g., word lines) may extend in respective horizontal planes. The conductive structures 205 may be stacked vertically, such that each conductive structure 205 is coupled to at least some of the vertical strings 207 of memory cells 203, and the vertical strings 207 of the memory cells 203 extend vertically through the stack structure including the conductive structures 205. The conductive structures 205 may be coupled to or may form control gates of the memory cells 203.

The first select gates 208 and the second select gates 210 may operate to select a vertical string 207 of the memory cells 203 interposed between data lines 202 and the source tier 204. Thus, an individual memory cell 203 may be selected and electrically coupled to a data line 202 by operation of (e.g., by selecting) the appropriate first select gate 208, second select gate 210, and conductive structure 205 that are coupled to the particular memory cell 203.

The staircase structure 220 may be configured to provide electrical connection between the access lines 206 and the conductive structures 205 through the vertical conductive contacts 211. In other words, an individual conductive structure 205 may be selected via an access line 206 in electrical communication with a respective vertical conductive contact 211 in electrical communication with the conductive structure 205. The data lines 202 may be electrically coupled to the vertical strings 207 through conductive contact structures 234.

Figure 6:
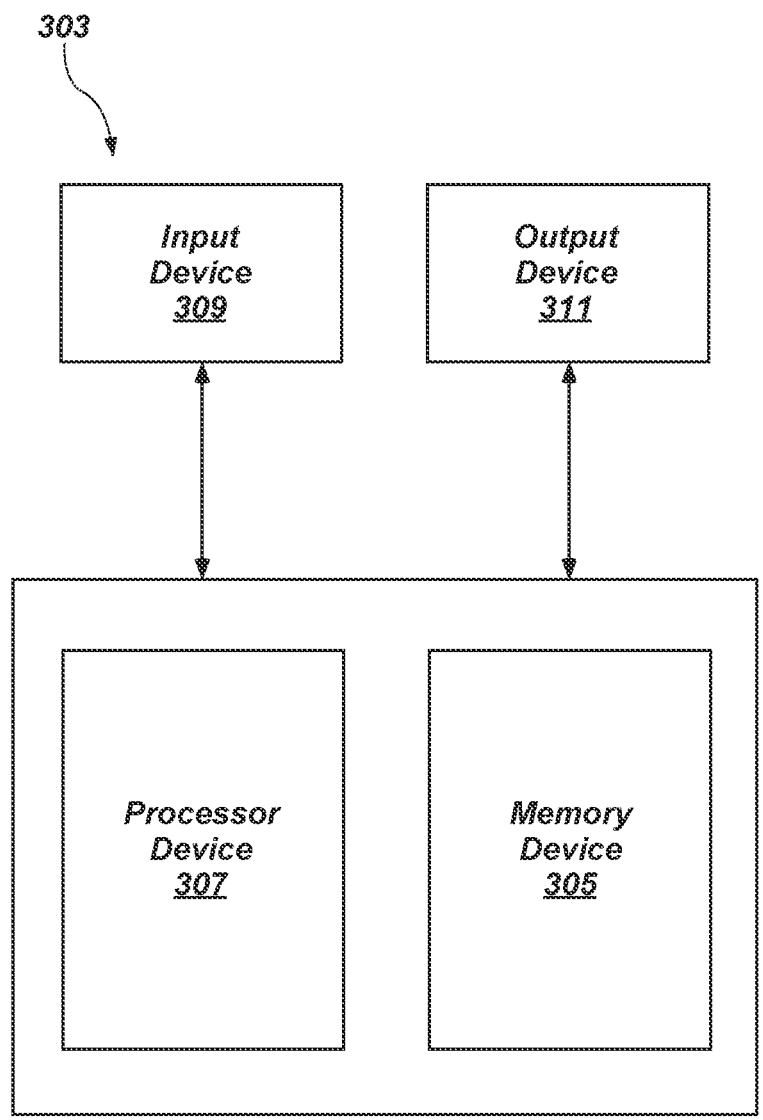
FIG. 6 is a block diagram of an electronic system according to embodiments of the disclosure.

Electronic devices (e.g., the electronic devices 100, 100', 200) including the reduced charge confinement regions 140 in the storage node 114 of the pillar 119, according to embodiments of the disclosure may be used in embodiments of electronic systems of the disclosure. For example, FIG. 6 is a block diagram of an electronic system 303, in accordance with embodiments of the disclosure. The electronic system 303 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 303 includes at least one memory device 305. The memory device 305 may include, for example, an embodiment of an electronic device (e.g., the electronic devices 100, 100', 200) previously described with reference to FIGS. 1A through 3F and FIG. 5, including the reduced charge confinement regions 140 in the storage node 114 of the pillar 119.

The electronic system 303 may further include at least one electronic signal processor device 307 (often referred to as a "microprocessor"). The electronic signal processor device 307 may, optionally, include an embodiment of an electronic device previously described herein (e.g., one or more of the electronic devices 100, 100', 200) previously described with reference to FIGS. 1A through 3F and FIG. 5. The electronic system 303 may further include one or more input devices 309 for inputting information into the electronic system 303 by a user, such as, for example, a mouse or other pointing device, a keyboard, a touchpad, a button, or a control panel. The electronic system 303 may further include one or more output devices 311 for outputting information (e.g., visual or audio output) to a user such as, for example, a monitor, a display, a printer, an audio output jack, a speaker, etc. In some embodiments, the input device 309 and the output device 311 may comprise a single touchscreen device that can be used both to input information to the electronic system 303 and to output visual information to a user. The input device 309 and the output device 311 may communicate electrically with one or more of the memory device 305 and the electronic signal processor device 307.

Figure 7:
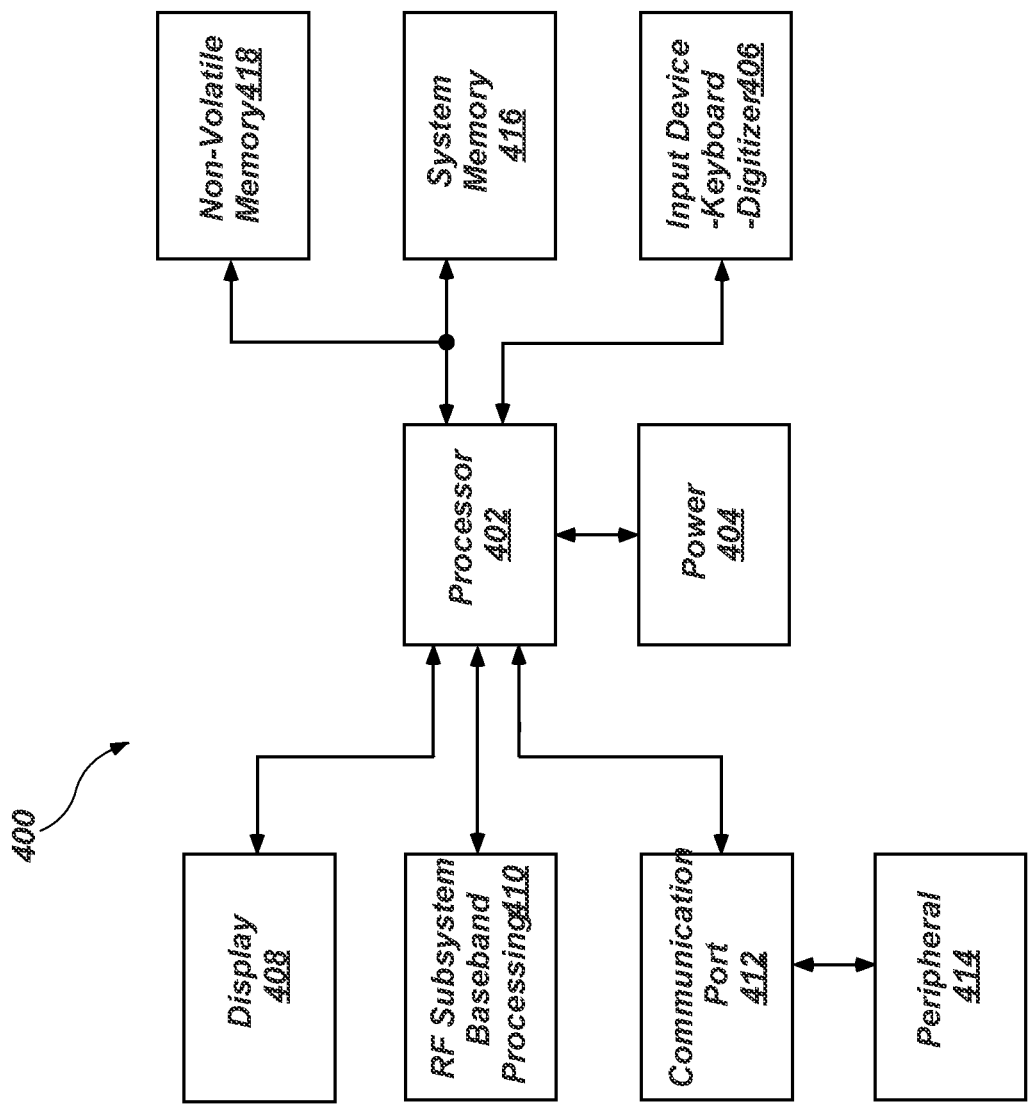
FIG. 7 is a block diagram of a processor-based system according to embodiments of the disclosure.

With reference to FIG. 7, depicted is a processor-based system 400. The processor-based system 400 may include various electronic devices (e.g., one or more of the electronic devices 100, 100', 200) manufactured in accordance with embodiments of the disclosure. The processor-based system 400 may be any of a variety of types such as a computer, pager, cellular phone, personal organizer, control circuit, or other electronic device. The processor-based system 400 may include one or more processors 402, such as a microprocessor, to control the processing of system functions and requests in the processor-based system 400. The processor 402 and other subcomponents of the processor-based system 400 may include electronic devices (e.g., one or more of the electronic devices 100, 100', 200) manufactured in accordance with embodiments of the disclosure.

The processor-based system 400 may include a power supply 404 in operable communication with the processor 402. For example, if the processor-based system 400 is a portable system, the power supply 404 may include one or more of a fuel cell, a power scavenging device, permanent batteries, replaceable batteries, and rechargeable batteries. The power supply 404 may also include an AC adapter; therefore, the processor-based system 400 may be plugged into a wall outlet, for example. The power supply 404 may also include a DC adapter such that the processor-based system 400 may be plugged into a vehicle cigarette lighter or a vehicle power port, for example.

Various other devices may be coupled to the processor 402 depending on the functions that the processor-based system 400 performs. For example, a user interface 406 may be coupled to the processor 402. The user interface 406 may include input devices such as buttons, switches, a keyboard, a light pen, a mouse, a digitizer and stylus, a touch screen, a voice recognition system, a microphone, or a combination thereof. A display 408 may also be coupled to the processor 402. The display 408 may include an LCD display, an SED display, a CRT display, a DLP display, a plasma display, an OLED display, an LED display, a three-dimensional projection, an audio display, or a combination thereof. Furthermore, an RF sub-system/baseband processor 410 may also be coupled to the processor 402. The RF sub-system/baseband processor 410 may include an antenna that is coupled to an RF receiver and to an RF transmitter (not shown). A communication port 412, or more than one communication port 412, may also be coupled to the processor 402. The communication port 412 may be adapted to be coupled to one or more peripheral devices 414, such as a modem, a printer, a computer, a scanner, or a camera, or to a network, such as a local area network, remote area network, intranet, or the Internet, for example.

The processor 402 may control the processor-based system 400 by implementing software programs stored in the memory. The software programs may include an operating system, database software, drafting software, word processing software, media editing software, or media playing software, for example. The memory is operably coupled to the processor 402 to store and facilitate execution of various programs. For example, the processor 402 may be coupled to system memory 416, which may include one or more of spin torque transfer magnetic random access memory (STT-MRAM), magnetic random access memory (MRAM), dynamic random access memory (DRAM), static random access memory (SRAM), racetrack memory, and other known memory types. The system memory 416 may include volatile memory, non-volatile memory, or a combination thereof. The system memory 416 is typically large so that it can store dynamically loaded applications and data. In some embodiments, the system memory 416 may include semiconductor devices, such as the electronic devices (e.g., the electronic devices 100, 100', 200) described above, or a combination thereof.

The processor 402 may also be coupled to non-volatile memory 418, which is not to suggest that system memory 416 is necessarily volatile. The non-volatile memory 418 may include one or more of STT-MRAM, MRAM, read-only memory (ROM) such as an EPROM, resistive read-only memory (RROM), and flash memory to be used in conjunction with the system memory 416. The size of the non-volatile memory 418 is typically selected to be just large enough to store any necessary operating system, application programs, and fixed data. Additionally, the non-volatile memory 418 may include a high-capacity memory such as disk drive memory, such as a hybrid-drive including resistive memory or other types of non-volatile solid-state memory, for example. The non-volatile memory 418 may include electronic devices, such as the electronic devices (e.g., the electronic devices 100, 100', 200) described above, or a combination thereof.

Accordingly, a system comprising a processor operably coupled to an input device and an output device, and a memory device operably coupled to the processor and comprising at least one electronic device is disclosed. The at least one electronic device comprises strings of memory cells vertically extending through a stack of alternating dielectric materials and conductive materials, a channel region within a pillar region of the at least one electronic device, a tunnel region adjacent to the channel region within the pillar region, and a storage node region adjacent to the tunnel region and extending continuously along a vertical direction of the pillar region. The storage node region comprises charge confinement regions in horizontal alignment with the conductive materials of the stack without being in horizontal alignment with the dielectric materials of the stack. The at least one electronic device comprises an oxide material between the dielectric materials and the conductive materials of the stack and the storage node region.

The electronic devices and systems of the disclosure advantageously facilitate one or more of improved simplicity, greater packaging density, and increased miniaturization of components as compared to conventional structures, conventional devices, and conventional systems. The methods of the disclosure facilitate the formation of devices (e.g., apparatuses, microelectronic devices, memory devices) and systems (e.g., electronic systems) having one or more of improved performance, reliability, and durability, lower costs, increased yield, increased miniaturization of components, improved pattern quality, and greater packaging density as compared to conventional devices (e.g., conventional apparatuses, conventional microelectronic devices, conventional memory devices) and conventional systems (e.g., conventional electronic systems).

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. An electronic device comprising:
   a stack of alternating dielectric materials and conductive materials arranged in tiers, each of the tiers including a dielectric material and a conductive material vertically neighboring the dielectric material;
   a pillar region extending vertically through the stack;
   an oxide material comprising a single material composition within the pillar region and laterally adjacent to and directly physically contacting the dielectric materials and the conductive materials of the stack; and
   a storage node laterally adjacent to and directly physically contacting the oxide material and within the pillar region, a charge confinement region of the storage node in horizontal alignment with the conductive materials of the stack, and a height of the charge confinement region in a vertical direction less than a height of a respective, laterally adjacent conductive material of the stack in the vertical direction.

2. The electronic device of claim 1, wherein the oxide material comprises a first portion laterally adjacent to the conductive materials of the stack and a second portion laterally adjacent to the dielectric materials of the stack, the second portion extending farther into a central portion of the pillar region relative to the first portion.

3. The electronic device of claim 2, wherein the storage node comprises a peripheral region in horizontal alignment with the dielectric materials of the stack, the peripheral region extending farther into the central portion of the pillar region relative to the charge confinement region.

4. The electronic device of claim 1, further comprising an insulative material within the pillar region, wherein a first portion of the insulative material in horizontal alignment with the conductive materials of the stack is relatively wider than a second portion of the insulative material in horizontal alignment with the dielectric materials of the stack.

5. The electronic device of claim 1, wherein the oxide material has a first thickness laterally adjacent to a central portion of one of the conductive materials of an individual tier of the stack and a second, greater thickness laterally adjacent to upper and lower portions of the one of the conductive materials of the individual tier.

6. The electronic device of claim 1, wherein the conductive materials of the stack are recessed relative to the dielectric materials of the stack adjacent to the pillar region, and a portion of the single material composition of the oxide material is vertically adjacent to and directly physically contacting neighboring portions of the dielectric materials.

7. The electronic device of claim 1, wherein the single material composition of the oxide material is vertically adjacent to and directly physically contacting the charge confinement region of the storage node.

8. The electronic device of claim 1, wherein a ratio of the height of the charge confinement region to the height of the respective, laterally adjacent conductive materials of the stack is between about 0.4 and about 0.7.

9. The electronic device of claim 1, wherein the height of the charge confinement region is between about 10 nm and about 25 nm and the height of the respective, laterally adjacent conductive materials of the stack is between about 25 nm and about 30 nm.

10. The electronic device of claim 1, wherein the electronic device is substantially devoid of an oxidized nitride material between the oxide material and the conductive materials of the stack.

11. A method of forming an electronic device, comprising:
   forming pillar regions extending vertically through a stack of alternating dielectric materials and nitride materials;
   removing portions of the nitride materials of the stack adjacent to the pillar regions to form recessed regions of the nitride materials;
   forming an oxide material comprising a single material composition within the pillar regions, the oxide material laterally adjacent to and directly physically contacting the dielectric materials of the stack and within the recessed regions of the nitride materials;
   forming a charge storage material laterally adjacent to and directly physically contacting the oxide material, the charge storage material comprising charge confinement regions of storage nodes within the pillar regions and in horizontal alignment with the nitride materials of the stack;
   removing additional portions of the nitride materials of the stack to form cell openings between the dielectric materials of the stack; and
   forming conductive materials in the cell openings to form a stack of alternating dielectric materials and conductive materials arranged in tiers, each of the tiers including a dielectric material and a conductive material vertically neighboring the dielectric material, a height of the charge confinement regions in a vertical direction less than a height of a respective, laterally adjacent conductive material of the conductive stack in the vertical direction.

12. The method of claim 11, wherein forming the charge storage material comprises forming the charge confinement regions relatively closer to the conductive materials than to the dielectric materials of the stack in a horizontal direction.

13. The method of claim 11, wherein removing the portions of the nitride materials of the stack comprises recessing the nitride materials between about 2 nm and about 4 nm relative to the dielectric materials of the stack.

14. The method of claim 11, wherein forming the oxide material laterally adjacent to the dielectric materials of the stack and within the recessed regions of the nitride materials comprises depositing a continuous portion of the oxide material using a single ALD process or a single CVD process without oxidizing a portion of the nitride materials of the stack.

15. The method of claim 11, further comprising oxidizing a region of the nitride materials of the stack to convert the region of the nitride materials into a sacrificial oxide material, wherein removing the additional portions of the nitride materials comprises substantially entirely removing the sacrificial oxide material and the nitride materials of the stack.

16. The electronic device of claim 1, wherein the oxide material directly physically contacts one of the dielectric materials of the stack on at least two consecutive sides.

17. The electronic device of claim 1, wherein the oxide material comprises varying thicknesses along a vertical extent of the pillar region.

18. The electronic device of claim 1, wherein a thickness of the oxide material laterally adjacent to one of the dielectric materials of the stack is relatively less than a thickness of the oxide material laterally adjacent to portions of one of the conductive materials.

19. The electronic device of claim 1, wherein a material composition of the oxide material is substantially the same as a material composition of the dielectric materials of the stack.

20. The electronic device of claim 1, wherein:
the storage node comprises a continuous portion extending along a vertical distance of the pillar region; and
a continuous portion of the oxide material substantially surrounds the continuous portion of the storage node.

21. The electronic device of claim 1, further comprising an additional dielectric material vertically intervening between the dielectric materials and the conductive materials of the stack.

22. An electronic device, comprising:
a stack comprising a vertically alternating sequence of conductive structures and insulative structures arranged in tiers; and
pillars extending vertically through the stack, the pillars individually comprising;
a channel material;
a tunnel region laterally adjacent to the channel material;
a storage node laterally adjacent to the tunnel region, a charge confinement region of the storage node in horizontal alignment with the conductive structures of the stack, and a height of an individual conductive structure relatively greater than a height of the charge confinement region laterally adjacent thereto; and
a single dielectric material intervening directly between the storage node and the conductive structures and the insulative structures of the stack, a portion of the single dielectric material intervening directly between vertically neighboring portions of the insulative structures.

23. The electronic device of claim 22, further comprising data lines vertically adjacent to the pillars and conductive plugs intervening between the data lines and the channel material of the pillars.

24. The electronic device of claim 23, wherein an uppermost conductive structure of the stack comprises a select gate structure, portions of the conductive plugs vertically overlapping the select gate structure.

25. The electronic device of claim 23, wherein upper surfaces of the conductive plugs, the tunnel region, the storage node, and the single dielectric material are substantially coplanar with one another.

26. The electronic device of claim 22, wherein the conductive structures comprise a conductive material and a metal nitride material surrounding the conductive material on at least three sides.

27. The electronic device of claim 22, wherein the single dielectric material comprises relatively thicker portions in horizontal alignment with upper and lower portions of individual conductive structures of the stack and relatively thinner portions in horizontal alignment with central portions of the individual conductive structures.

28. The electronic device of claim 22, wherein an upper boundary of the charge confinement region is defined by a first portion of the single dielectric material and a lower boundary of the charge confinement region is defined by a second portion of the single dielectric material.

* * * * *

UNITED STATES PATENT AND TRADEMARK OFFICE
CERTIFICATE OF CORRECTION

PATENT NO. : 11,956,954 B2
APPLICATION NO. : 17/092916
DATED : April 9, 2024
INVENTOR(S) : Yifen Liu et al.

It is certified that error appears in the above-identified patent and that said Letters Patent is hereby corrected as shown below:

In the Specification

Column 6, Line 19, change "silicon-on-insulator ("SOT")" to --silicon-on-insulator ("SOI")--

Column 15, Line 41, change "silicon dioxide (Sift). The" to --silicon dioxide ($SiO_2$).--

Signed and Sealed this
Twenty-fourth Day of September, 2024

Katherine Kelly Vidal
*Director of the United States Patent and Trademark Office*